United States Patent
Hori

(10) Patent No.: US 8,923,436 B2
(45) Date of Patent: Dec. 30, 2014

(54) TRANSMITTER AND METHOD FOR CONTROLLING SAME

(75) Inventor: Shinichi Hori, Tokyo (JP)

(73) Assignee: Nec Corporation, Tokyo (JP)

( * ) Notice: Subject to any disclaimer, the term of this patent is extended or adjusted under 35 U.S.C. 154(b) by 17 days.

(21) Appl. No.: 13/813,997

(22) PCT Filed: Apr. 26, 2011

(86) PCT No.: PCT/JP2011/002452
§ 371 (c)(1),
(2), (4) Date: Feb. 4, 2013

(87) PCT Pub. No.: WO2012/017580
PCT Pub. Date: Feb. 9, 2012

(65) Prior Publication Data
US 2013/0142283 A1   Jun. 6, 2013

(30) Foreign Application Priority Data

Aug. 3, 2010  (JP) ................. 2010-174453

(51) Int. Cl.
| | | |
|---|---|---|
| H03C 1/52 | (2006.01) |
| H04W 52/02 | (2009.01) |
| H03F 1/02 | (2006.01) |
| H03F 3/189 | (2006.01) |
| H03F 3/217 | (2006.01) |
| H03F 3/24 | (2006.01) |

(52) U.S. Cl.
CPC ......... *H04W 52/0209* (2013.01); *H03F 1/0222* (2013.01); *H03F 3/189* (2013.01); *H03F 3/217* (2013.01); *H03F 3/24* (2013.01); *H03F 3/245* (2013.01); *H03F 2200/336* (2013.01); *H03F 2200/91* (2013.01); *H03F 2200/408* (2013.01)

USPC ........... 375/300; 375/295; 375/296; 375/299; 375/302; 375/316

(58) Field of Classification Search
USPC ......... 375/222, 229, 295, 296, 298, 299, 300, 375/302, 306, 316, 320, 328, 336, 340
See application file for complete search history.

(56) References Cited

U.S. PATENT DOCUMENTS 6,750,719 B2 * 6/2004 Toyota et al. ............... 330/285
8,253,487 B2 * 8/2012 Hou et al. .................... 330/127

(Continued)

FOREIGN PATENT DOCUMENTS

| JP | H01254014 A | 10/1989 |
| JP | 2010141521 A | 6/2010 |
| WO | 2008093665 A | 8/2008 |

OTHER PUBLICATIONS

The international search report for PCT/JP2011/002452 mailed on Jun. 7, 2011.

(Continued)

*Primary Examiner* — Hirdepal Singh
(74) *Attorney, Agent, or Firm* — Sughrue Mion, PLLC

(57) ABSTRACT

An RF signal generator divides an input radio signal into an amplitude signal and a phase signal and outputs the amplitude signal and the phase signal. A switching amplifier amplifies the radio signal with the amplitude signal and the phase signal. The switching amplifier includes at least one variable current source that is controlled by the amplitude signal and supplies a current to the switching amplifier. The switching amplifier includes at least one switching elements that connects the variable current source to one of a terminal connected a ground potential and an output terminal of the switching amplifier according to the phase signal.

18 Claims, 22 Drawing Sheets

(56) References Cited

U.S. PATENT DOCUMENTS

| | | | |
|---|---|---|---|
| 8,620,240 B2* | 12/2013 | Yamanouchi et al. | 455/127.1 |
| 8,675,725 B2* | 3/2014 | Staszewski et al. | 375/238 |
| 2005/0032488 A1* | 2/2005 | Pehlke et al. | 455/127.1 |
| 2005/0191976 A1* | 9/2005 | Shakeshaft et al. | 455/118 |
| 2005/0233714 A1* | 10/2005 | Kajiwara et al. | 455/127.3 |
| 2008/0074209 A1* | 3/2008 | Ceylan et al. | 332/144 |
| 2009/0163156 A1* | 6/2009 | Rofougaran et al. | 455/127.1 |
| 2010/0001793 A1* | 1/2010 | Van Zeijl et al. | 330/10 |
| 2010/0066429 A1 | 3/2010 | Ikedo et al. | |
| 2012/0056676 A1* | 3/2012 | Frambach | 330/295 |
| 2012/0188024 A1* | 7/2012 | Yamanouchi | 332/108 |

OTHER PUBLICATIONS

R. Leberer, R. Reber, and M. Oppermann, An AlGaN/GaN class-S amplifier for RF-communication signals, IEEE/MTT-S International Microwave Symposium 2008, Jun. 2008, pp. 85-88.

Kobayashi, H.; Hinrichs, J.M.; Asbeck, P.M.; Current-mode class-D power amplifiers for high-efficiency RF applications, Microwave Theory and techniques, Dec. 1, 2001, vol. 49, issue 12, pp. 2480-2485.

* cited by examiner

TRANSMITTER AND METHOD FOR CONTROLLING SAME

This application is a National Stage Entry of PCT/JP2011/002452 filed Apr. 26, 2011, which claims priority from Japanese Patent Application 2010-174453 filed Aug. 3, 2010, the contents of all of which are incorporated herein by reference, in their entirety.

TECHNICAL FIELD

The present invention relates to a transmitter used for a communication device, such as a cellular phone or a wireless LAN, and a method for controlling the same, and more particularly, to a transmitter having an excellent power efficiency, and a method for controlling the same.

BACKGROUND ART

A transmission unit of a communication device, such as a cellular phone or a wireless LAN, is required to operate with low power consumption. Such a transmission unit of a communication device is required to operate with low power consumption regardless of the magnitude of output power, and is also required to ensure a high accuracy of transmission signals. In particular, a power amplifier disposed at a final stage of a transmission unit of a communication device occupies 50% or more of the power consumption of the entire transmitter. For this reason, the power amplifier disposed at the final stage of the transmission unit of the communication device needs to have a high power efficiency.

In recent years, a switching amplifier has been attracting attention as a power amplifier that is expected to achieve a high power efficiency. The switching amplifier receives pulse-shape signals. The switching amplifier amplifies the power of received pulse-shape signals while maintaining the pulse shape. The pulse-shape signals amplified by the switching amplifier are transmitted from an antenna after frequency components other than desired frequency components are sufficiently suppressed by a filter element.

A current mode class-D amplifier (hereinafter referred to as "CMCD"), which is a typical switching amplifier, will now be described. FIG. 17 is a circuit block diagram showing a configuration example of a CMCD 6. The CMCD 6 includes variable current sources 61 and 62, switching elements 63 and 64, a load 65, and a filter circuit 66. The variable current sources 61 and 62 are connected in parallel with a power supply VDD. The switching element 63 is connected between the variable current source 61 and a ground GND. The switching element 64 is connected between the variable current source 62 and the ground GND. The load 65 and the filter circuit 66 are connected in parallel between an output terminal of the switching element 63 and an output terminal of the switching element 64.

Pulse signals are input to control terminals of the switching elements 63 and 64. The pulse signal input to the control terminal of the switching element 64 is a signal complementary to the pulse signal input to the control terminal of the switching element 63. Thus, when one of the switching elements 63 and 64 is turned on, the other of the switching elements is controlled to be turned off. The current source connected to the switching element in the OFF state supplies a current to the load 65 and the filter circuit 66. A current from the current source connected to the switching element flows into the switching element in the ON state. Further, a current from the current source connected to the switching element in the OFF state flows into the switching element in the ON state through the load 65 and the filter circuit 66.

A typical class-AB power amplifier and the like require a bias current. On the other hand, the CMCD requires no bias current. Accordingly, a power loss in the CMCD is equal to the sum of a switching loss generated during charging/discharging to/from a parasitic capacitance and a heat loss generated in a parasitic resistance. Accordingly, when the parasitic capacitance and the parasitic resistance are ideally zero, the power loss of the CMCD is "0".

Next, a configuration example of a transmitter 700 incorporating the CMCD 6 will be described. FIG. 18 is a circuit block diagram showing a configuration example of the transmitter 700 incorporating the CMCD 6. The transmitter 700 includes an RF signal generator 71, a driver amplifier 72, and the CMCD 6.

The RF signal generator 71 includes a digital baseband (hereinafter referred to as "DBB") 711, sigma-delta modulators 712 and 713, a digital up-converter 714, and an inverter 715. In the case of W-CDMA, for example, the DBB 711 generates a radio signal which is a multi-bit signal of 10 bits or more. On the other hand, a pulse signal representing information by two states (1 bit) of high and low can be input to the CMCD 6. Accordingly, it is necessary to convert the multi-bit signal output from the DBB 711 into a 1-bit signal that is subjected to over-sampling in advance. The sigma-delta modulators 712 and 713 are used as means for converting a multi-bit signal into a 1-bit signal by over-sampling.

Each signal output from the sigma-delta modulators 712 and 713 is output as a pulse signal through the digital up-converter 714. The pulse signal output from the digital up-converter 714 is divided into two signals. One of the divided pulse signals is inverted by the inverter 715. A non-inverted pulse signal is input to the switching element 63 of the CMCD 6 through the driver amplifier 72. The inverted pulse signal is input to the switching element 64 of the CMCD 6 through the driver amplifier 72.

The sigma-delta modulators 712 and 713 described above can favorably maintain noise characteristics in the vicinity of a desired frequency band. Accordingly, in this configuration example, a multi-bit radio signal can be converted into a pulse signal and the pulse signal can be input to the CMCD 6, while maintaining satisfactory noise characteristics.

CITATION LIST

Non Patent Literature

Non Patent Literature 1: R. Leberer, R. Reber, and M. Oppermann, "An AlGaN/GaN Class-S Amplifier for RF-Communication Signals", IEEE/MTT-S International Microwave Symposium 2008, June 2008, pp. 85-88.

SUMMARY OF INVENTION

Technical Problem

However, the inventor has found that highly efficient power amplification cannot be achieved in practice in the above-mentioned circuit configuration example. FIG. 19 is a graph showing output voltage waveforms of the switching elements 63 and 64 when a W-CDMA signal is converted into a 1-bit signal by sigma-delta modulation. A curve L63 represents the output voltage waveform of the switching element 63. A curve L64 represents the output voltage waveform of the switching element 64. A line G63 represents the waveform of the pulse signal input to the control terminal of the switching element 63. When consecutive OFF signals are input to the control terminal of the switching element 63, an output voltage (curve L63) of the switching element 63 fluctuates to the minus side.

Here, consideration is given to the case where each of the switching elements 63 and 64 is composed of an FET element. In this case, a voltage at the drain terminal of the FET element fluctuates to the minus side. The FET element is turned off when the voltage at the drain terminal is equal to or higher than 0 and a gate potential is smaller than a threshold (Vth) with respect to a source potential. However, when the voltage at the drain terminal fluctuates to the minus side and the difference between the gate potential and the drain potential is equal to or greater than the threshold (Vth), the channel is opened and comes into a conductive state.

Therefore, to maintain the OFF state even when the voltage at the drain terminal fluctuates to the minus side in the FET element, it is necessary to cause the gate potential to follow the drain potential and to fluctuate to the minus side. In other words, it is necessary to constantly set the difference between the gate potential and the drain potential to be equal to or smaller than Vth. In general, when a W-CDMA signal of 100 W class is output, the potential at the drain terminal fluctuates to the minus side by about several tens of volts. Accordingly, it is necessary to cause the voltage of the OFF signal, which is applied to the gate of the switching element, to fluctuate to the minus side by about several tens of volts. On the other hand, it is necessary to cause the ON signal to fluctuate to the plus side by several volts. Accordingly, the potential difference between the ON signal and the OFF signal to be applied to the gate of the switching element is about several tens of volts.

A power Pdrv necessary to drive the gate of the switching element is expressed by the following expression (1). Hereinafter, Cgs represents a gate capacitance; Vgs represents a potential difference between the ON signal and the OFF signal to be applied to the gate; and f represents a switching frequency.

$$Pdrv = Cgs \cdot Vgs2 \cdot f \quad (1)$$

As shown in the expression (1), the power Pdrv is proportional to the square of the potential difference Vgs. In a typical device, several volts are required as the potential difference Vgs. The power Pdrv at this time is about several watts. Accordingly, in the state where the potential difference Vgs is several tens of volts, the power Pdrv is several hundred watts, resulting in a considerable increase in power consumption.

The present invention has been made in view of the above-mentioned problems, and an object of the present invention is to provide a transmitter having favorable noise characteristics and excellent power efficiency, and a method for controlling the same.

Solution to Problem

A transmitter according to an exemplary aspect of the present invention includes: an RF signal generator that divides an input radio signal into an amplitude signal and a phase signal and outputs the amplitude signal and the phase signal; and a switching amplifier that amplifies the radio signal with the amplitude signal and the phase signal. The switching amplifier includes: at least one variable current source that is controlled by the amplitude signal and supplies a current to the switching amplifier; and at least one switching element that connects the variable current source to one of a ground potential and an output terminal of the switching amplifier according to the phase signal.

A method for controlling a transmitter according to another exemplary aspect of the present invention includes: dividing an input radio signal into an amplitude signal and a phase signal and outputting the amplitude signal and the phase signal; amplifying the radio signal with the amplitude signal and the phase signal; and connecting a variable current source controlled by the amplitude signal to one of a ground potential and an output terminal according to the phase signal.

Advantageous Effects of Invention

According to the present invention, it is possible to provide a transmitter having favorable noise characteristics and excellent power efficiency, and a method for controlling the same.

DESCRIPTION OF EMBODIMENTS

Figure 1:
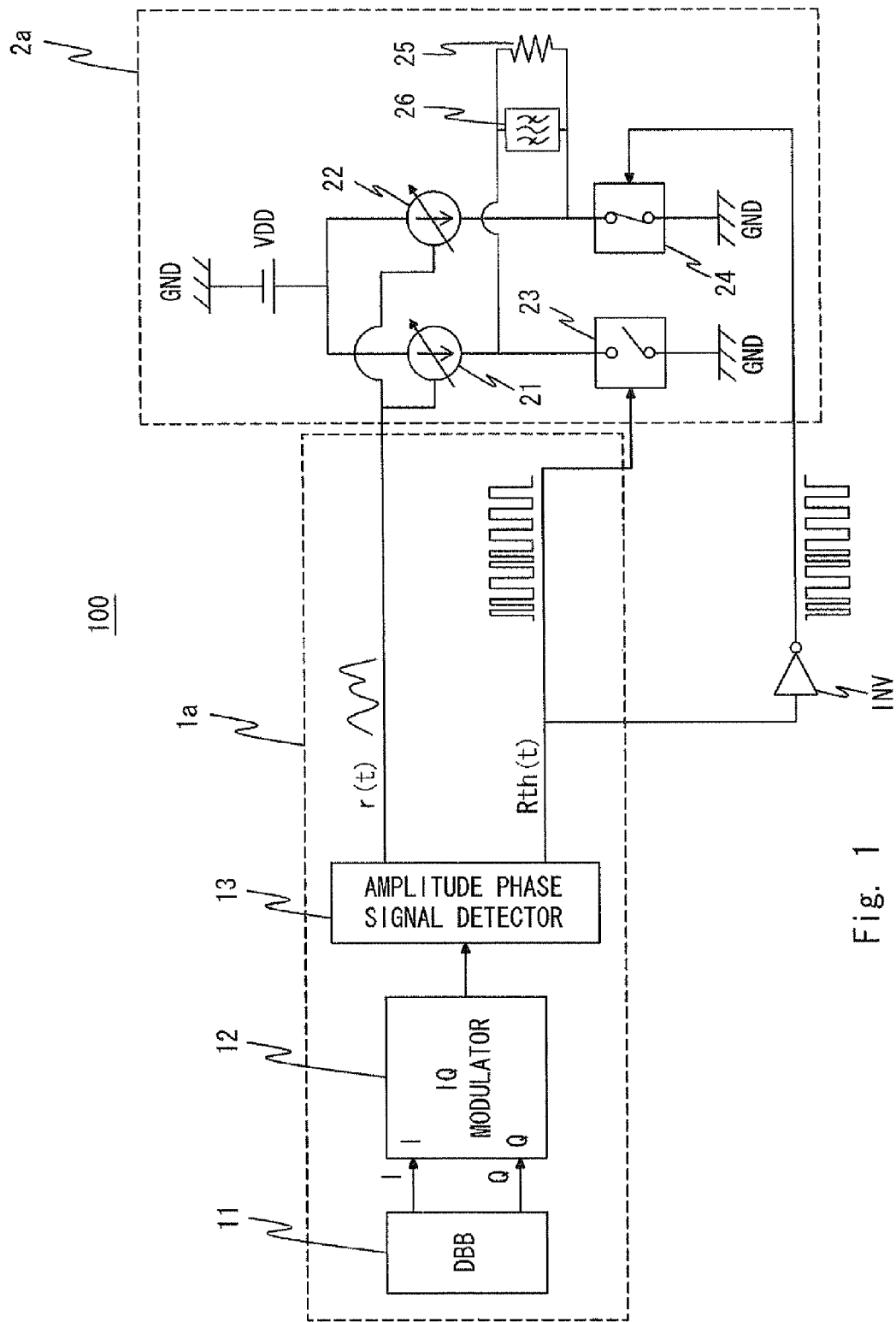
FIG. 1 is a block diagram showing a configuration of a transmitter 100 according to a first exemplary embodiment.

Exemplary embodiments of the present invention will be described below with reference to the drawings. In the drawings, the same elements are denoted by the same reference numerals, and repeated explanation is omitted as needed. Hereinafter, assume that a current mode class-D amplifier (hereinafter referred to as "CMCD") is one mode of a switching amplifier.

First Exemplary Embodiment

First, a transmitter according to a first exemplary embodiment of the present invention will be described. FIG. 1 is a block diagram showing a configuration of a transmitter 100 according to the first exemplary embodiment. The transmitter 100 includes an RF signal generator 1a and a current mode class-D amplifier 2a.

The RF signal generator 1a includes a digital baseband (hereinafter referred to as "DBB") 11, an IQ modulator 12, and an amplitude phase signal detector 13. The DBB 11 generates IQ signals. The IQ modulator 12 converts the IQ signals into an RF signal RF(t) by IQ modulation. Here, "t" is a variable representing time. The RF signal RF(t) is generally expressed by the following expression (2) using an amplitude signal r(t) and a phase signal th(t).

$$RF(t)=r(t)\cdot th(t) \quad (2)$$

The phase signal th(t) is expressed by the following expression (3).

$$th(t)=\cos(\omega c \cdot t + \text{theta}(t)) \quad (3)$$

where ωc is an angular velocity obtained by multiplying a carrier frequency by 2π, and theta(t) is a phase variation.

The amplitude phase signal detector 13 separates and extracts the amplitude signal r(t) and the phase signal th(t) which are included in the RF signal RF(t). The amplitude phase signal detector 13 outputs the amplitude signal r(t) and a rectangular phase signal Rth(t) which is obtained by forming the phase signal th(t) into a rectangular shape. When the phase signal th(t) is equal to or greater than 0, the value of the rectangular phase signal Rth(t) is "1". When the phase signal th(t) is smaller than 0, the value of the rectangular phase signal Rth(t) is "0". A relationship as expressed by the following expression (4) is established between the phase signal th(t) and the rectangular phase signal Rth(t).

$$Rth(t)=th(t)+dis(t) \quad (4)$$

where dis(t) is composed of a harmonic component of the(t).

The CMCD 2a includes variable current sources 21 and 22, switching elements 23 and 24, a load 25, and a filter circuit 26. The variable current sources 21 and 22 are connected in parallel with a power supply VDD. The switching element 23 is connected between the variable current source 21 and a ground GND. The switching element 24 is connected between the variable current source 22 and the ground GND. The load 25 and the filter circuit 26 are connected in parallel between an output terminal of the switching element 23 and an output terminal of the switching element 24. The amplitude signal r(t) is input to the variable current sources 21 and 22 as a control signal. The rectangular phase signal Rth(t) is input to the switching element 23 as a control signal. A complementary signal of the rectangular phase signal Rth(t) is input to the switching element 24 as a control signal through an inverter INV.

A flow of a current in the CMCD 2a will now be described. First, a description is given of the case where the switching element 23 is turned off and the switching element 24 is turned on. In this case, a current flows into the switching element 24 from the variable current source 21 through the load 25 and the filter circuit 26. Further, a current flows into the switching element 24 from the variable current source 22. Subsequently, a description is given of the case where the switching element 23 is turned on and the switching element 24 is turned off. In this case, a current flows into the switching element 23 from the variable current source 22 through the load 25 and the filter circuit 26. Further, a current flows into the switching element 23 from the variable current source 21. That is, the pulse-like current, the flow direction of which is reversed so as to correspond to opening and closing operations of the switching elements 23 and 24, is input to the load 25 and the filter circuit 26.

Figure 2:
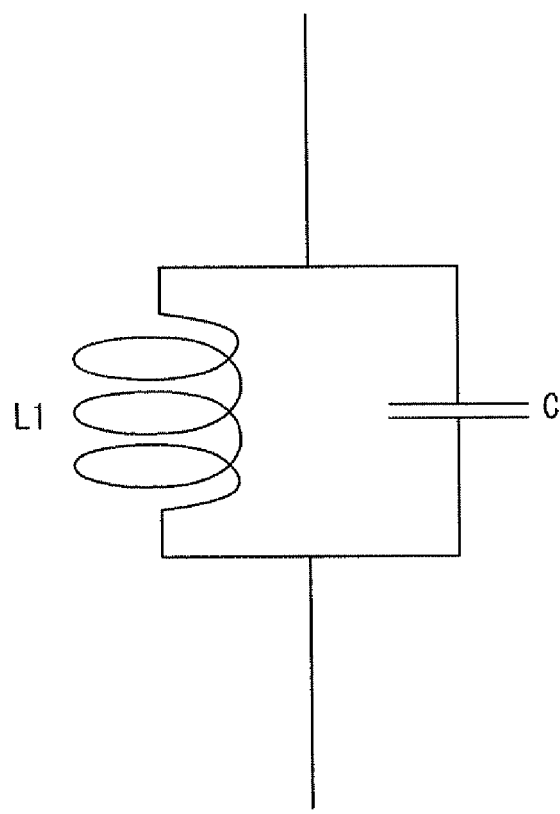
FIG. 2 is a circuit diagram showing a configuration example of a filter circuit 26 according to the first exemplary embodiment.

Next, a configuration example of the filter circuit 26 will be described. FIG. 2 is a circuit diagram showing a configuration example of the filter circuit 26. The filter circuit 26 includes an inductor L1 and a capacitor C1. The inductor L1 and the capacitor C1 are connected in parallel. The impedance of the filter circuit 26 increases (closer to an open condition) toward a resonance point. On the other hand, the impedance of the filter circuit 26 decreases (closer to a short-circuit condition) as the distance from the resonance point.

Suitable setting of a constant of each element that forms the filter circuit 26 allows the resonance point of the filter circuit 26 to match a desired bandwidth of a radio signal. As a result, a state close to the open condition is achieved for the desired bandwidth. On the other hand, a state close to the short-circuit condition is set for bandwidths other than the desired bandwidth. Accordingly, only the desired band component of the pulse current is supplied through the load 25. As a result, the radio signal from which undesired harmonic components are removed is extracted.

Assume herein that a current value output from the variable current sources 21 and 22 is represented by I(t). A control signal given to each switching element is represented by P(t). The control signal P(t) is a 1-bit signal having two states of "1" and "−1". When the control signal P(t) is "1", the switching element 23 is turned on. When the control signal P(t) is "−1", the switching element 24 is turned on. Accordingly, a current signal Dout(t) output to each of the load 25 and filter circuit 26 is expressed by the following expression (5).

$$Dout(t)=I(t)\cdot P(t) \quad (5)$$

Further, the current signal Dout(t) is expressed by the following expression (6).

$$Dout(t) = r(t) \cdot Rth(t) \qquad (6)$$
$$= r(t) \cdot (th(t) + dis(t))$$
$$= r(t) \cdot th(t) + r(t) \cdot dis(t)$$

The resonance frequency of the filter circuit 26 is set to correspond to r(t)·th(t) that is included in Dout(t). This allows only r(t)·th(t) to be input to the load 25. In other words, only the RF signal can be extracted by the CMCD 2a.

Figure 3:
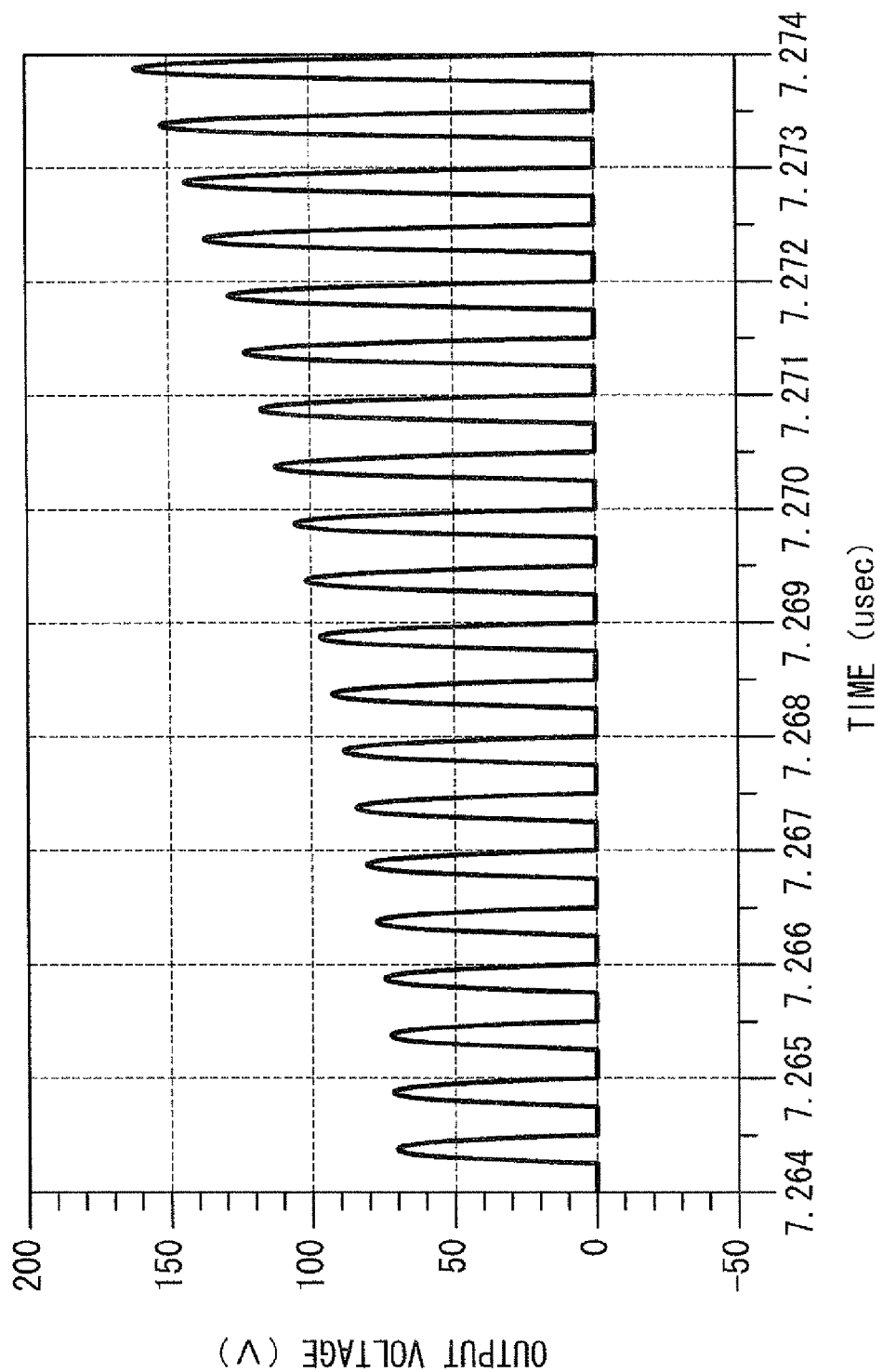
FIG. 3 is a graph showing an output waveform of a current mode class-D amplifier (CMCD) 2a according to the first exemplary embodiment.
Figure 19:
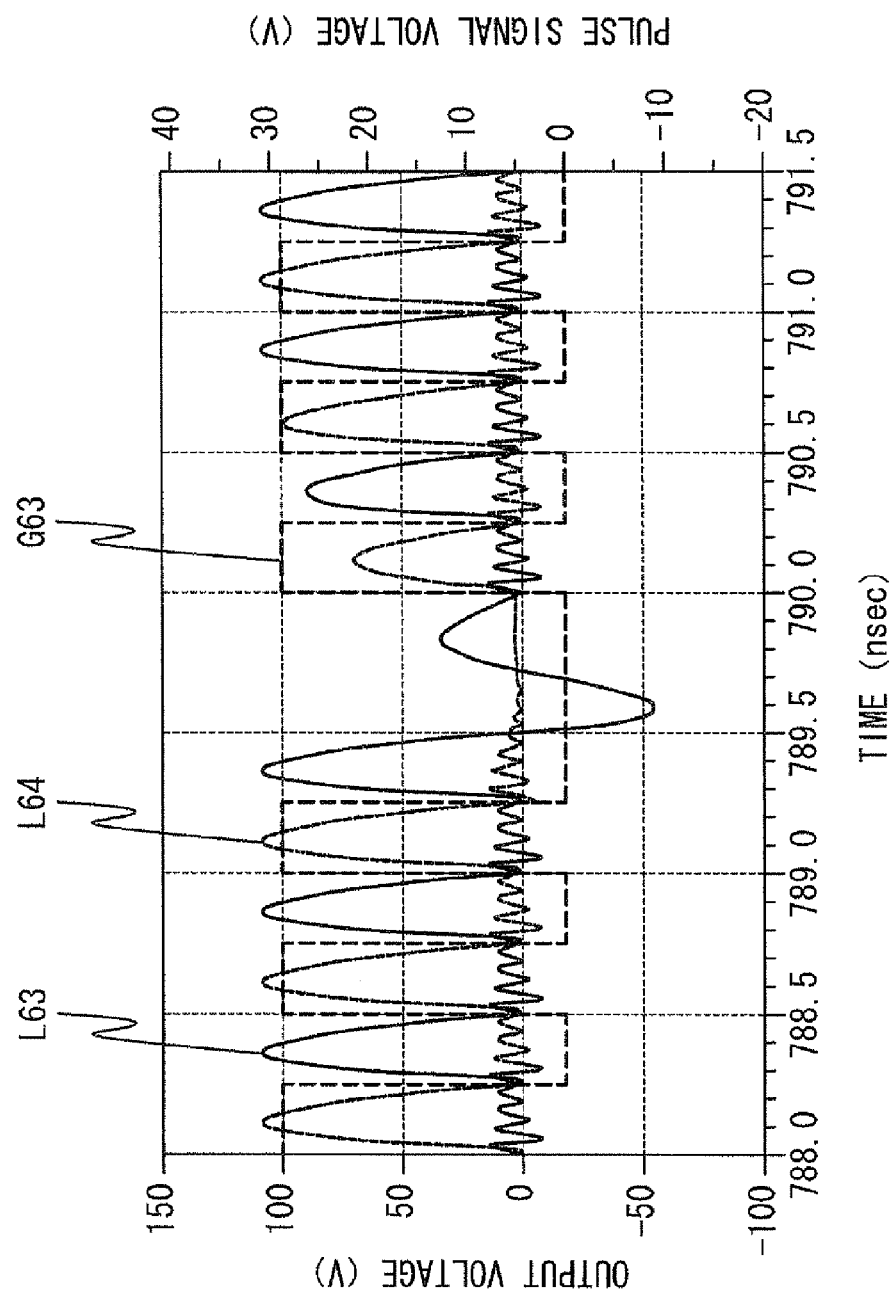
FIG. 19 is a graph showing output voltage waveforms of switching elements 63 and 64 when a W-CDMA signal is converted into a 1-bit signal by sigma-delta modulation.

FIG. 3 is a graph showing an output waveform of the CMCD 2a. Referring to FIG. 3, unlike the example illustrated in FIG. 19, it can be confirmed that the CMCD 2a can resolve the phenomenon that the output voltage fluctuates greatly to the minus side, while performing an amplitude modulation. Thus, even when FET elements are used as the switching elements 23 and 24, a voltage difference of about several V between high and low signals to be supplied to gates is sufficient. Accordingly, in the transmitter 100 including the CMCD 2a, driving power can be minimized.

Figure 4:
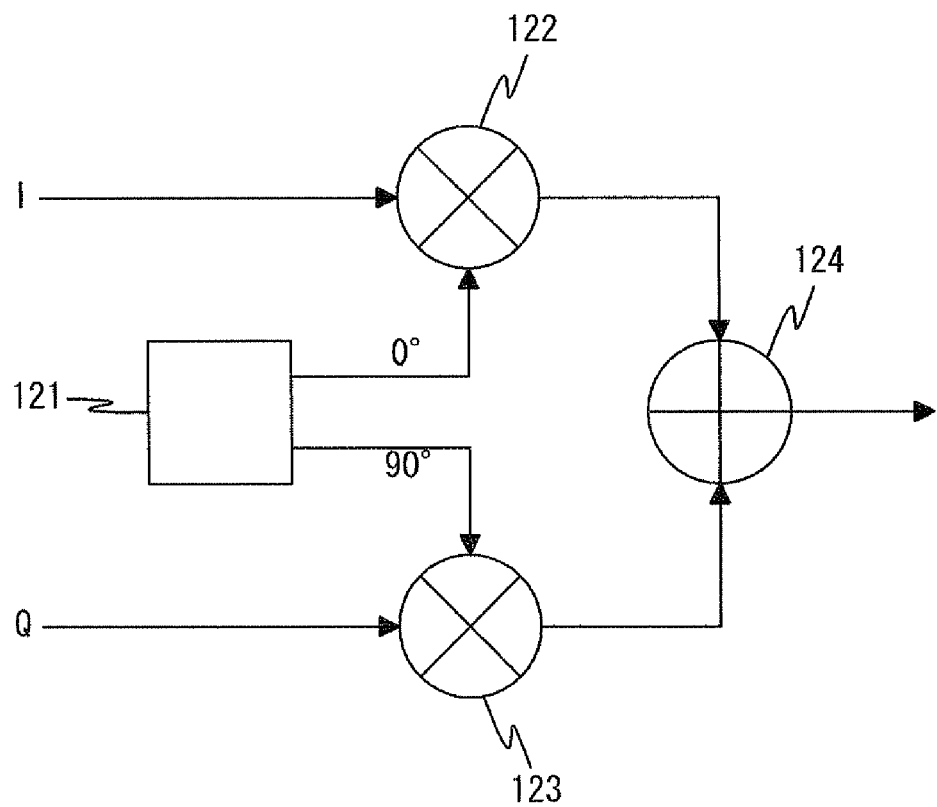
FIG. 4 is a block diagram showing a configuration example of an IQ modulator 12 according to the first exemplary embodiment.

A configuration example of each unit of the transmitter 100 will be described below. First, a configuration example of the IQ modulator 12 will be described. FIG. 4 is a block diagram showing a configuration example of the IQ modulator 12. The IQ modulator 12 includes an IQ local oscillator 121, a mixer 122, a mixer 123, and a synthesizer 124.

The IQ local oscillator 121 generates two sinusoidal wave voltage signals having a phase difference of 90° therebetween. These two sinusoidal wave voltage signals have a frequency equal to the carrier frequency of the RF signal. The mixer 122 and the mixer 123 output the product of the signals input from two input terminals. The mixer 122 receives an I signal from the DBB 11 and a sinusoidal wave voltage signal generated in the IQ local oscillator 121. The mixer 123 receives a Q signal from the DBB 11 and a sinusoidal wave voltage signal generated in the local oscillator. The synthesizer 124 outputs the sum of the signals input from the two input terminals.

Assume that one of the sinusoidal wave voltage signals generated in the IQ local oscillator 121 is represented by vlo_i, and the other of the sinusoidal wave voltage signals is represented by vlo_q. The voltage signal vlo_i is input to the mixer 122. The voltage signal vlo_q is input to the mixer 123. There is a phase difference of 90 degrees between the voltage signal vlo_i and the voltage signal vlo_q. Accordingly, the voltage signal vlo_i and the voltage signal vlo_q are expressed by the following expressions (7) and (8), respectively.

$$vlo\_i = A\cos(\omega ct) \qquad (7)$$

$$vlo\_q = A\sin(\omega ct) \qquad (8)$$

where ωc is an angular frequency corresponding to the carrier frequency.

Assume herein that a voltage of a baseband signal I which is input to the mixer 122 is represented by Vbb_i and a voltage of a baseband signal Q which is input to the mixer 123 is represented by Vbb_q. The baseband signals Vbb_i and Vbb_q are expressed by the following expressions (9) and (10), respectively.

$$Vbb\_i = B\cos(\omega bt + \theta) \qquad (9)$$

$$Vbb\_q = -B\sin(\omega bt + \theta) \qquad (10)$$

where B represents amplitude information; θ represents phase information; and ωb represents an angular frequency corresponding to an intermediate frequency.

The mixer 122 outputs the product of a voltage signal Vlo_i and the voltage Vbb_i of the baseband signal I. The mixer 123 outputs the product of a voltage signal Vlo_q and the voltage Vbb_q of the baseband signal Q. An output voltage signal Vmix1 of the mixer 122 is expressed by the following expression (11). An output voltage signal Vmix2 of the mixer 123 is expressed by the following expression (12).

$$V\text{mix}1 = 0.5 \times AB\{\cos((\omega c + \omega b)t + \theta) + \cos((\omega c - \omega b)t - \theta)\} \qquad (11)$$

$$V\text{mix}2 = 0.5 \times AB\{\cos((\omega c + \omega b)t + \theta) - \cos((\omega c - \omega b)t - \theta)\} \qquad (12)$$

The synthesizer 124 outputs the sum of the output voltage signal Vmix1 of the mixer 122 and the output voltage signal Vmix2 of the mixer 123. An output voltage signal Vcomb of the synthesizer 124 is expressed by the following expression (13).

$$V\text{comb} = AB\cos((\omega c + \omega b)t + \theta) \qquad (13)$$

The output voltage signal Vcomb is an RF signal obtained by increasing the frequency by ωc from the angular frequency of the baseband signal.

Figure 5A:
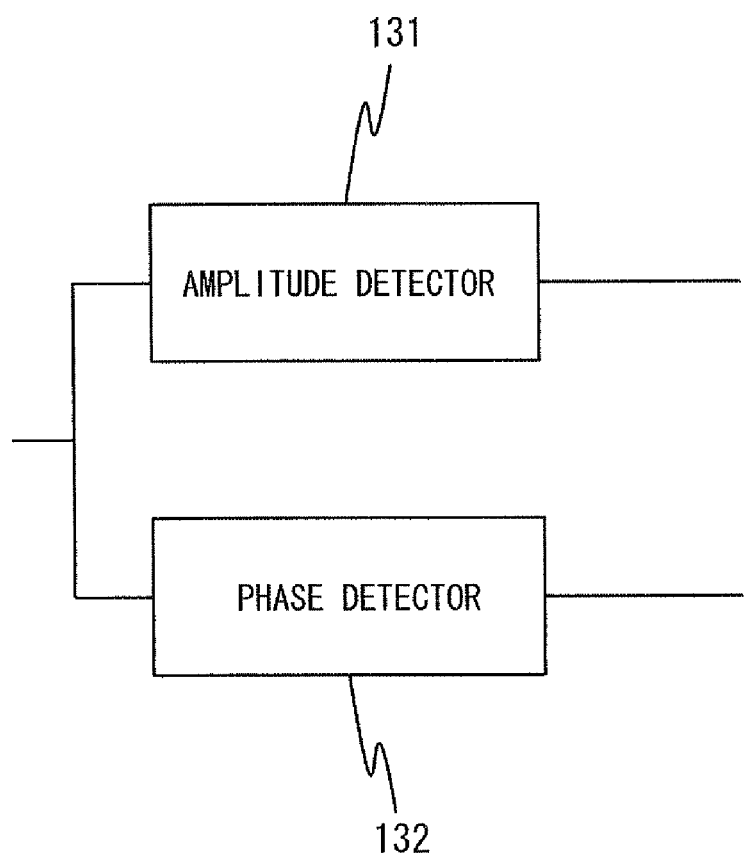
FIG. 5A is a block diagram showing a configuration example of an amplitude phase signal detector according to the first exemplary embodiment.

Next, the amplitude phase signal detector 13 will be described. FIG. 5A is a block diagram showing a configuration example of the amplitude phase signal detector 13. The amplitude phase signal detector 13 includes an amplitude detector 131 and a phase detector 132.

Figure 5B:
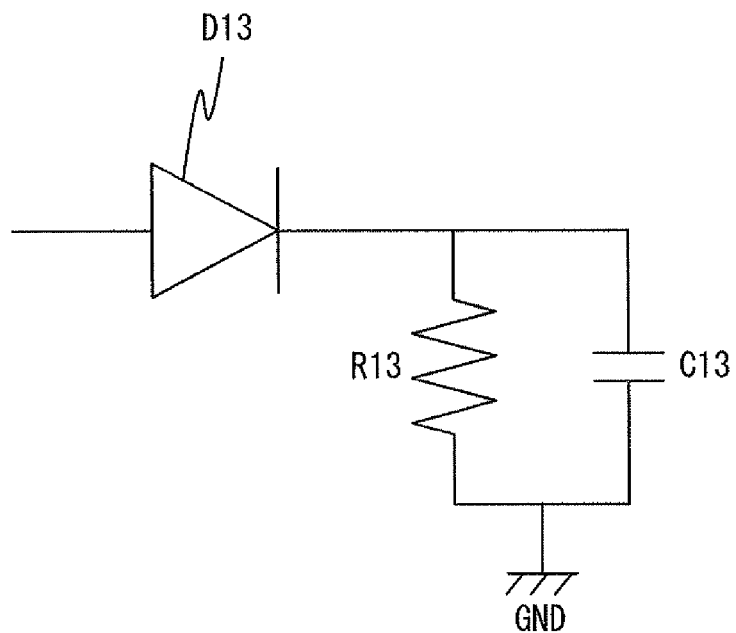
FIG. 5B is a circuit diagram showing a configuration example of an amplitude detector 131 according to the first exemplary embodiment.

FIG. 5B is a circuit diagram showing a configuration example of the amplitude detector 131. The amplitude detector 131 includes a diode D13, a resistor R13, and a capacitor C13. The diode D13 outputs a current which is proportional to the square of the input voltage. Accordingly, when the RF signal is input to the diode, as the amplitude value increases, the time average value of the current value output from the diode D13 increases. The resistor R13 and the capacitor C13, which are connected to the subsequent stage of the diode D13, form a filter circuit. This filter circuit extracts only a DC component included in the output current of the diode D13. The extracted DC component is equivalent to the time average value of the output current of the diode D13. That is, as the amplitude value of the RF signal increases, the value of the DC component increases. In other words, the DC component of the output current of the diode D13 is a one-to-one function that increases monotonously with respect to the amplitude value of the RF signal input to the diode D13. Accordingly, the extracted DC component makes it possible to extract the amplitude information included in the RF signal.

Figure 5C:
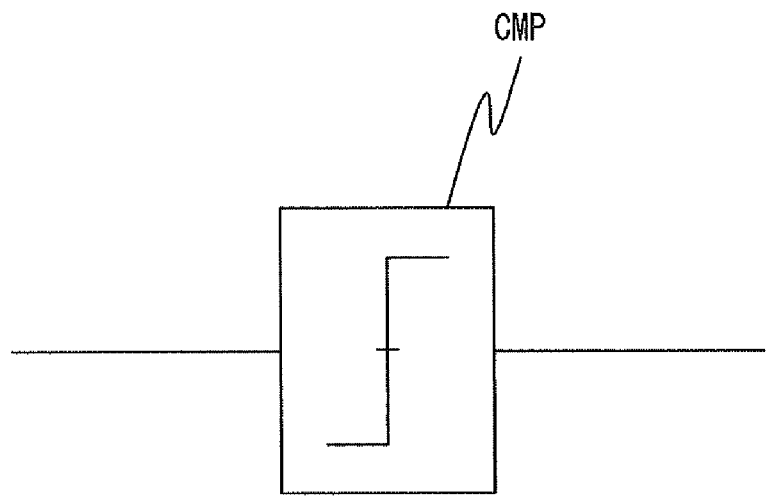
FIG. 5C is a block diagram showing a configuration example of a phase detector 132 according to the first exemplary embodiment.

FIG. 5C is a block diagram showing a configuration example of the phase detector 132. The phase detector 132 includes a comparator CMP. The comparator CMP outputs a high signal when the input signal takes a positive value, and outputs a low signal when the input signal takes a negative value. When the phase is in the range of 0° to 180°, the RF signal takes a positive value, and when the phase is in the range of 180° to 360°, the RF signal takes a negative value. Accordingly, upon receiving the RF signal, the phase detector 132 outputs the high signal when the phase of the RF signal is in the range of 0° to 180°, and outputs the low signal when the phase of the RF signal is in the range of 180° to 360°. The output of the comparator CMP is ideally a rectangular wave.

Figure 6A:
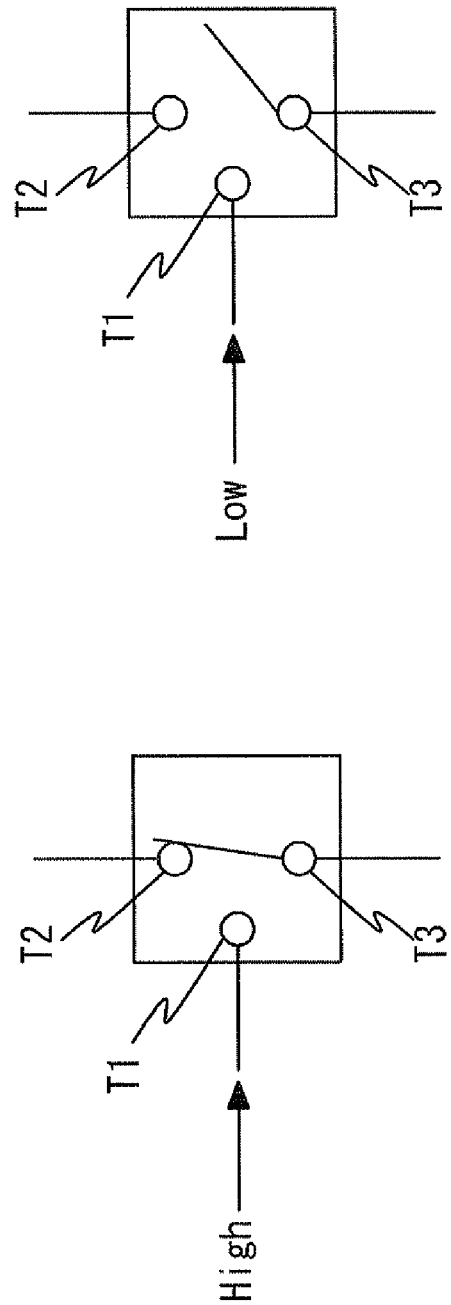
FIG. 6A is a configuration diagram showing an operation of a switching element 23 according to the first exemplary embodiment.
Figure 6B:
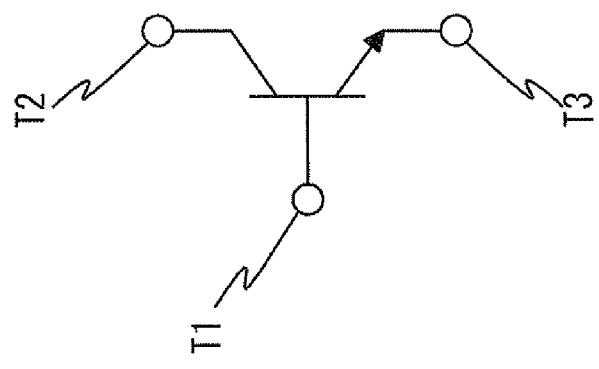
FIG. 6B is a circuit diagram showing a configuration example of the switching element 23 according to the first exemplary embodiment.
Figure 6B:
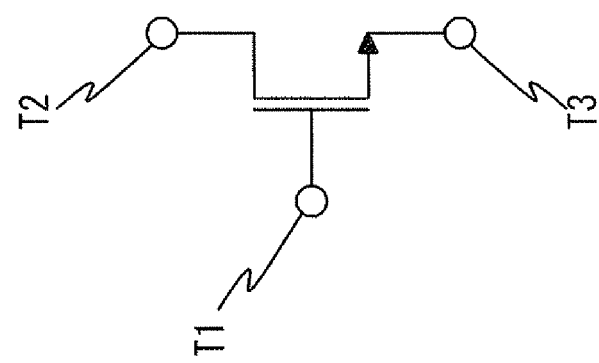

Next, the switching elements 23 and 24 will be described. FIG. 6A is a configuration diagram showing an operation of the switching element 23. The switching element 23 has a control terminal T1, a signal terminal T2, and a signal terminal T3. When the high signal is input to the control terminal T1, the signal terminal T2 and the signal terminal T3 are brought into the short-circuit state (ON state). When the low signal is input to the control terminal T1, the signal terminal T2 and the signal terminal T3 are brought into the non-connected state (OFF state). FIG. 6B is a circuit diagram showing a configuration example of the switching element 23. The switching element 23 can be implemented using a field-effect transistor (FET) or a bipolar transistor. The control terminal T1 corresponds to a gate terminal of an FET or a base terminal of a bipolar transistor. The signal terminal T2 corresponds to a source terminal of an FET or an emitter terminal of a bipolar transistor. The signal terminal T3 corresponds to a drain terminal of an FET or a collector terminal of a bipolar transistor. The operation and configuration of the switching element 24 are similar to those of the switching element 23, so the description thereof is omitted.

Figure 7:
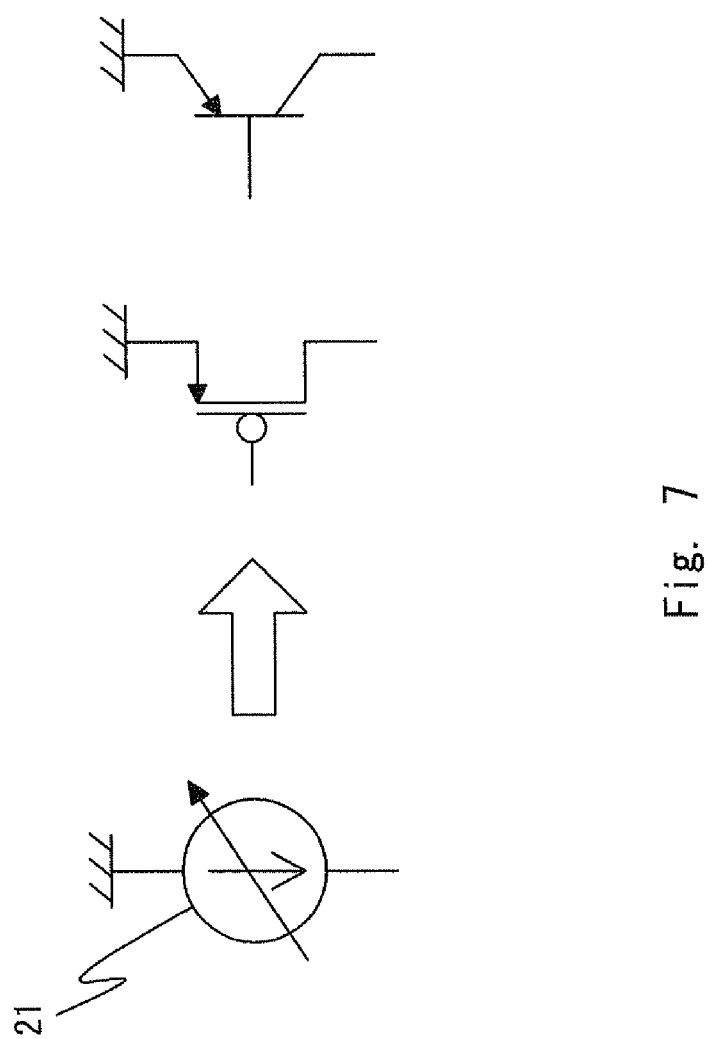
FIG. 7 is a circuit diagram showing a configuration example of a variable current source 21 according to the first exemplary embodiment.

Next, the variable current sources 21 and 22 will be described. FIG. 7 is a circuit diagram showing a configuration example of the variable current source 21. The variable current source 21 is composed of an FET. The control signal of the variable current source 21 is given to the gate terminal of the FET. The value of a current flowing between the drain and the source of the FET is proportional to the square of a difference between a gate potential and a threshold voltage in a saturation region. That is, the gate potential and the current flowing between the drain and the source have a 1:1 relation. Accordingly, the current can be controlled by the gate potential. Note that the variable current source 21 can also be composed of a bipolar transistor. The configuration of the variable current source 22 is similar to that of the variable current source 21, so the description thereof is omitted.

Figure 8:
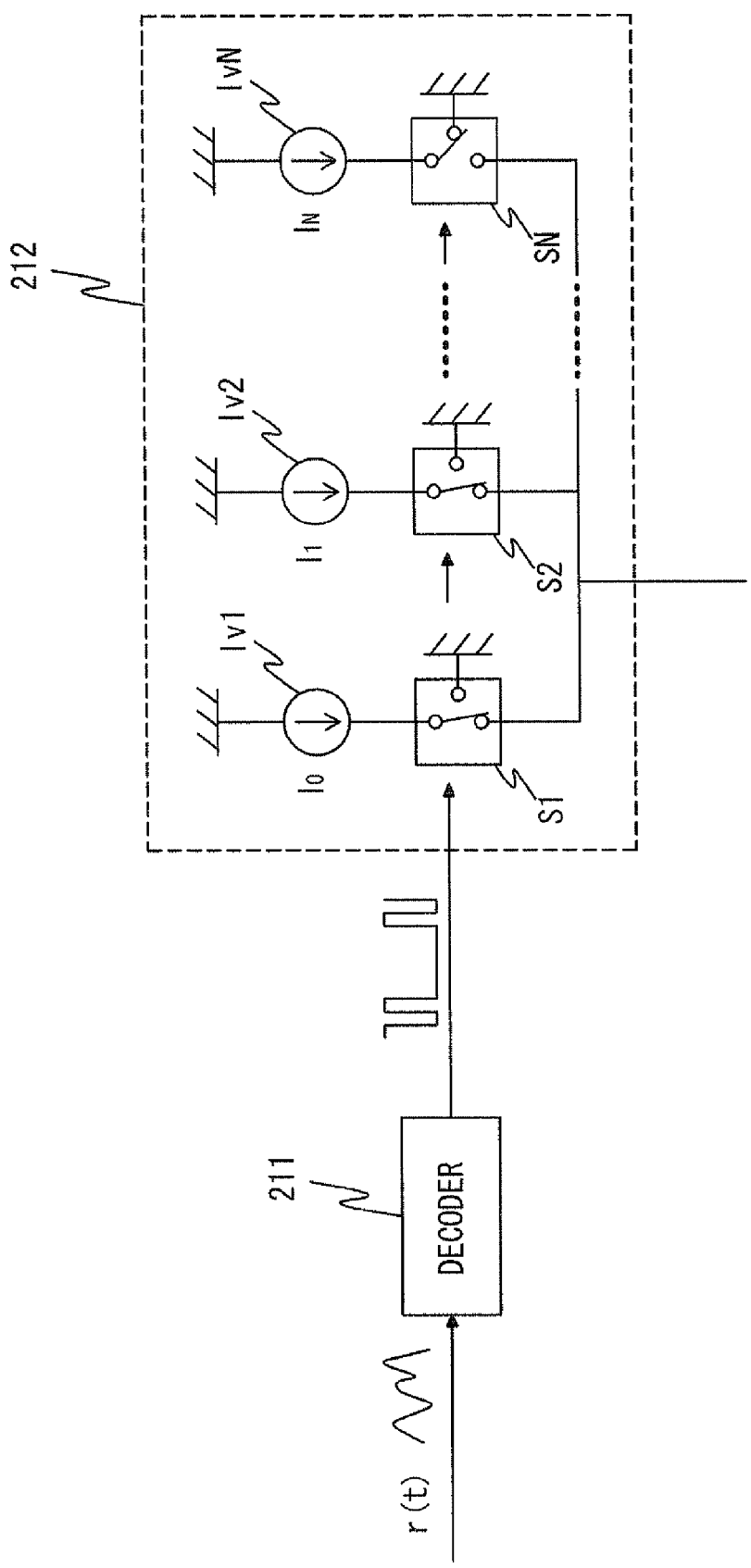
FIG. 8 is a circuit diagram showing another configuration example of the variable current source 21 according to the first exemplary embodiment.

FIG. 8 is a circuit diagram showing another configuration example of the variable current source 21. The variable current source 21 shown in FIG. 8 includes a decoder 211 and a pulse variable current source 212. The pulse variable current source 212 includes one or more DC current sources Iv1 to IvN and current switches S1 to SN respectively connected to output terminals of the DC current sources Iv1 to IvN. A current switch Sn (n is an integer equal to or greater than 1) switches an output destination of a current output from the DC current source Ivn to a ground node or an output node of the pulse variable current source 212. The current output from the pulse variable current source 212 is equal to the sum of currents output from the DC current sources connected to the output node of the pulse variable current source 212 through the current switches.

The amplitude signal r(t) generated in the RF signal generator 1a is input to the decoder 211. When the amplitude signal r(t) generated in the RF signal generator 1a is an N-bit digital signal, the pulse variable current source 212 is provided with the DC current sources Iv1 to IvN. A current value In of the DC current source Ivn is weighted by a power of 2. Specifically, the current value In is represented by $I0 \times 2^{-n}$. Here, I0 represents a given value. The decoder 211 sequentially allocates the bits of the amplitude signal r(t) from the highest bit as control signals for the current switches S1 to SN respectively connected to the DC current sources Iv1 to IvN. When the amplitude signal r(t) is an analog signal, this analog signal is converted into an N-bit digital signal by AD conversion. The digital signal generated by AD conversion is input to the decoder 211.

Figure 9:
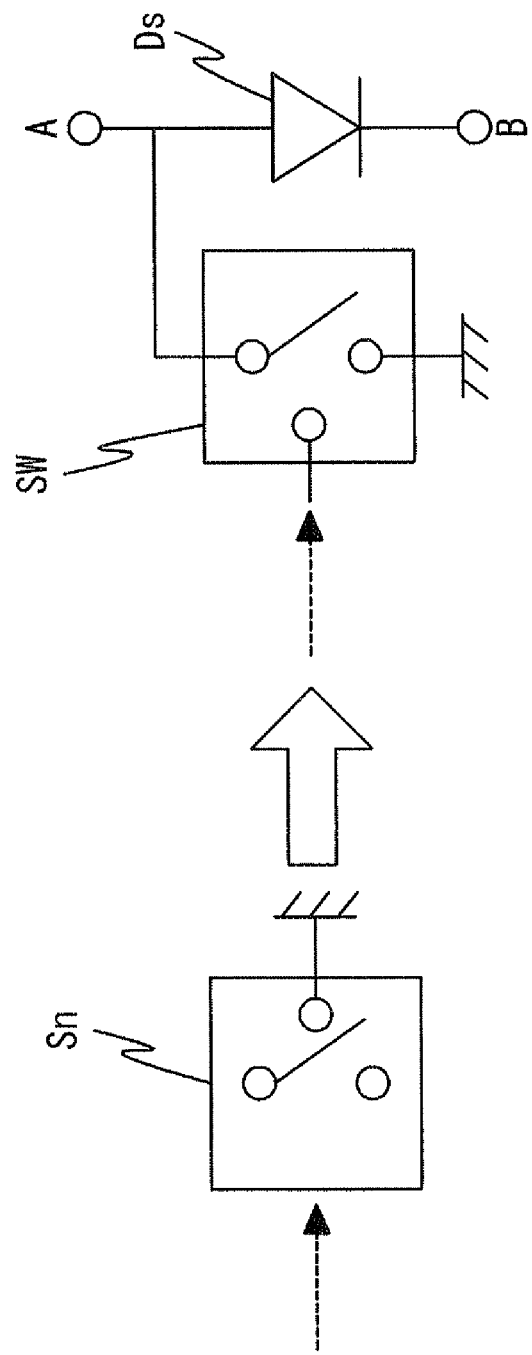
FIG. 9 is a block diagram showing a configuration example of a current switch Sn according to the first exemplary embodiment.

Subsequently, the current switch Sn will be described. FIG. 9 is a block diagram showing a configuration example of the current switch Sn. The current switch Sn includes a diode Ds and a current switching element SW. The current switching element SW may have a configuration shown in FIG. 6B, for example. The current switching element SW is disposed between an anode-side terminal of the diode Ds and a ground potential (or a given DC potential). The anode-side terminal of the diode Ds is further connected to a terminal A. A cathode-side terminal of the diode Ds is connected to a terminal B.

When the current switching element SW is in the opened state, a current input to the terminal A is output to the terminal B through the diode Ds. When the current switching element SW is in the short-circuit state, the current input to the terminal A is output to the ground potential through the current switching element SW.

Figure 10:
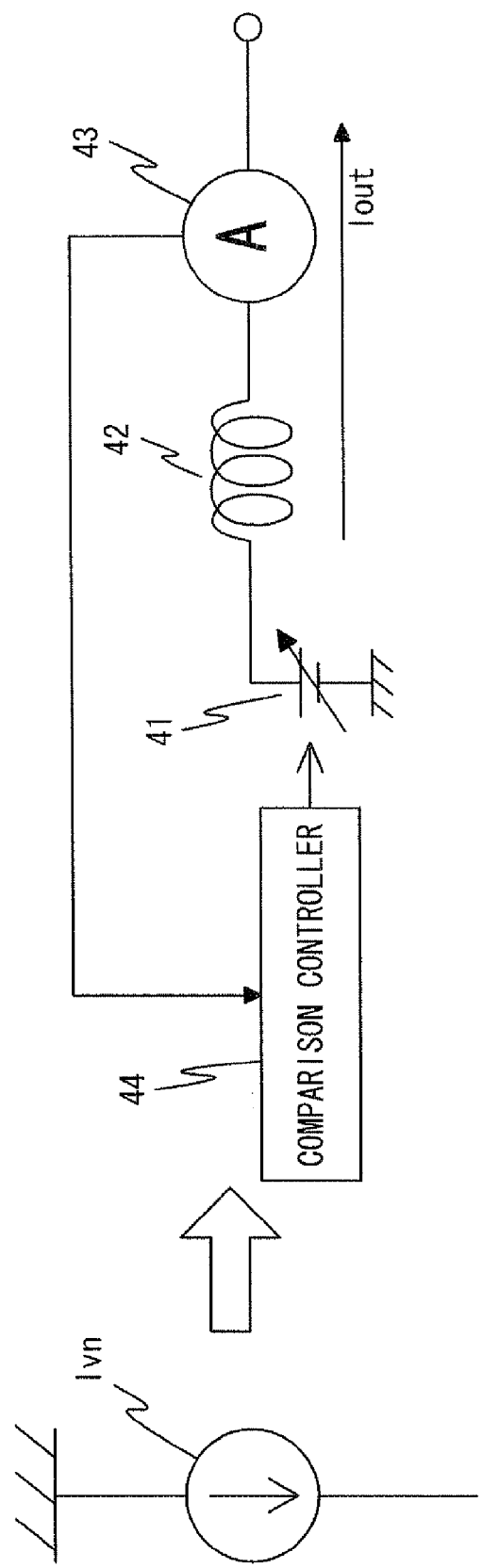
FIG. 10 is a block diagram showing a configuration example of a DC current source Ivn according to the first exemplary embodiment.

Subsequently, the DC current source Ivn will be described. FIG. 10 is a block diagram showing a configuration example of the DC current source Ivn. The DC current source Ivn includes a variable DC voltage source 41, an inductor 42, a current sensor 43, and a comparison controller 44. A current output from the variable DC voltage source 41 is output through the inductor 42 and the current sensor 43. The current sensor 43 detects the magnitude of the current flowing through the current sensor 43. The comparison controller 44 controls the voltage of the variable DC voltage source 41 so that the current value detected by the current sensor 43 becomes a desired value.

Assume herein that the voltage value of the variable DC voltage source 41 is represented by Vdc. The inductance of the inductor 42 is represented by Ladd. The value of a load resistance connected to the output terminal of the DC current source Ivn is represented by Rload. The output current of the DC current source Ivn is represented by Tout. Assuming that the voltage value Vdc represents an input signal and Tout represents an output signal, a transfer function F(s) is expressed by the following expression (14).

$$F(s) = R\text{load}/(s \cdot L\text{add} + R\text{load}) \tag{14}$$

The above expression shows that the transfer function F(s) is a transfer function of a lowpass filter in which a 3 dB cutoff frequency is given by $R\text{load}/(2 \cdot \pi \cdot L\text{add})$. The control signal given to the variable DC voltage source 41 is updated at a speed sufficiently higher than the above-mentioned cutoff frequency, thereby minimizing the variation characteristic of the output current Tout.

Figure 11:
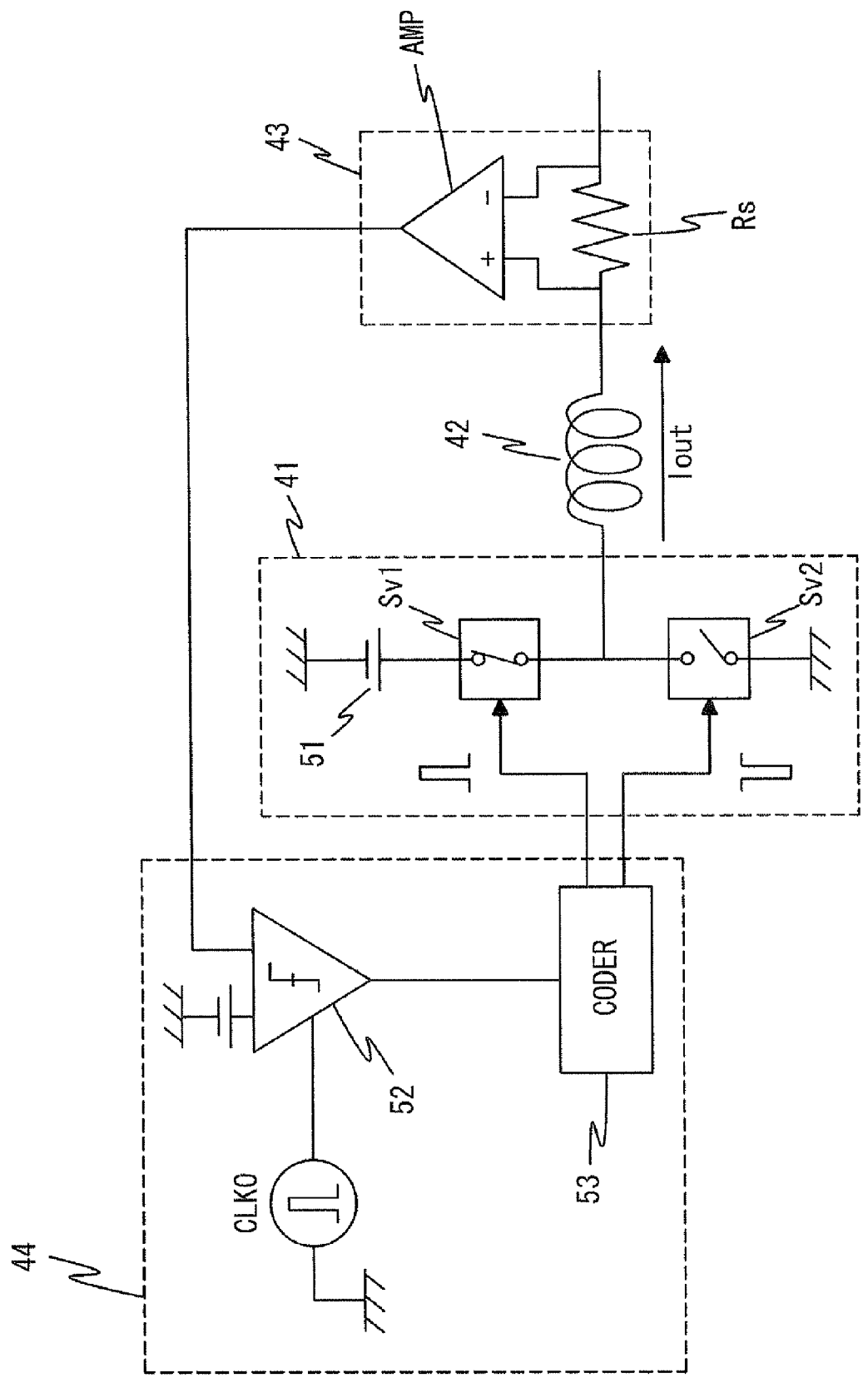
FIG. 11 is a block diagram showing a specific example of the configuration of the DC current source Ivn according to the first exemplary embodiment.

The configuration of the DC current source Ivn will be described in more detail. FIG. 11 is a block diagram showing a specific example of the configuration of the DC current source Ivn. The variable DC voltage source 41 has a configuration in which switching elements Sv1 and Sv2 are disposed in series between a DC voltage source 51 and a ground terminal. The switching elements Sv1 and Sv2 may have a configuration shown in FIG. 6B, for example. The switching element Sv1 located on the power supply side and the switching element Sv2 located on the ground side perform complementary opening/closing operations. Specifically, when one of the switching elements Sv1 and Sv2 is turned on, the other of the switching elements is turned off. When the switching element Sv1 is turned on, the output voltage of the variable DC voltage source 41 is equal to the power supply voltage. On the other hand, when the switching element Sv2 is turned on, the output voltage of the variable DC voltage source 41 is equal to the ground potential.

The current sensor 43 includes a resistor Rs and a differential input type amplifier AMP. The differential input type amplifier AMP receives voltage information at both terminal nodes of the resistor Rs. When the input current flows through the resistor Rs, a voltage difference which is equal to the product of the current and the resistance value is generated at the both ends of the resistor Rs. The differential input type amplifier AMP amplifies and outputs the voltage difference (in this exemplary embodiment, the amplification factor is a positive value). Note that the voltage difference between the both ends of the resistor Rs and the output value of the differential input type amplifier AMP have a 1:1 relation. That is, the current sensor 43 is capable of converting the current value of the input current into a voltage value and outputting the voltage value.

The comparison controller 44 includes a voltage comparator 52 and a coder 53. The voltage comparator 52 compares the voltage value output from the current sensor 43 with an internal reference value. The case where the output from the current sensor 43 is larger than the internal reference value indicates that the amount of current flowing through the current sensor 43 is larger than a desired value. In this case, the coder 53 outputs a control signal that brings the ground-side switching element Sv2, which forms the variable DC voltage source 41, into the ON state, and brings the power-supply-side switching element Sv1 into the OFF state. On the other hand, the case where the output from the current sensor 43 is smaller than the internal reference value indicates that the amount of current flowing through the current sensor 43 is smaller than the desired value. In this case, the coder 53 outputs a control signal which brings the ground-side switching element Sv2, which forms the variable DC voltage source 41, into the OFF state, and brings the power-supply-side switching element Sv1 into the ON state.

The comparison controller 44 operates in synchronization with an external clock signal from an external clock signal source CLKO. Specifically, the cycle of performing a comparison operation in the voltage comparator 52 and updating the control signal to be supplied to the variable DC voltage source 41 is equal to the cycle of the external clock signal source CLKO. Even when the load connected to the DC current source Ivn is temporally varied, the comparison controller is caused to operate using the clock signal source that generates a clock signal having a sufficiently shorter cycle than the variation cycle. This allows the control signal for the variable DC voltage source 41 to be updated in a period shorter than the variation cycle of the load. The operation described above allows the DC current source Ivn to continuously output a desired DC current.

Figure 12:
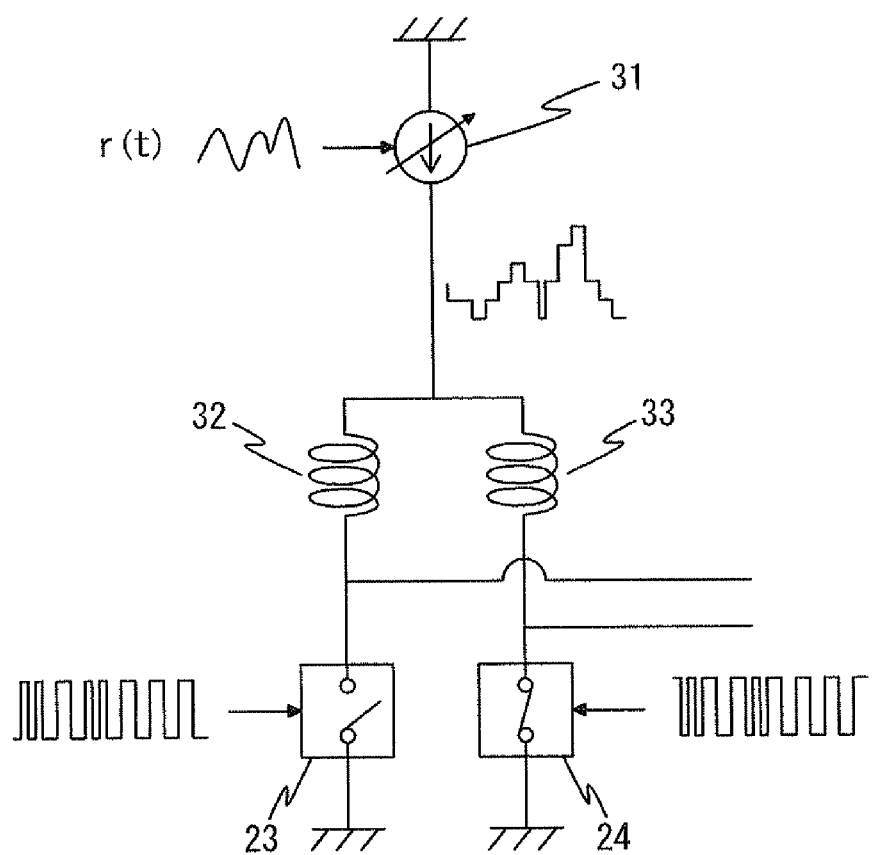
FIG. 12 is a block diagram showing a configuration of a CMCD 2b as a first configuration transformed example of a current mode class-D amplifier (CMCD) according to the first conversion embodiment.

Subsequently, configuration transformed examples of the CMCD will be described. FIG. 12 is a block diagram showing a configuration of a CMCD 2b which is a first configuration transformed example of the CMCD. The CMCD 2b includes a variable current source 31, inductors 32 and 33, and the switching elements 23 and 24. The switching elements 23 and 24 are similar to those of the CMCD 2a. One end of the variable current source 31 is connected to the power supply VDD. The other end of the variable current source 31 is connected to the switching element 23 through the inductor 32, and is also connected to the switching element 24 through the inductor 33. The variable current source 31 is controlled by the amplitude signal r(t), for example. The other components of the CMCD 2b are similar to those of the CMCD 2a, so the description thereof is omitted.

The inductors 32 and 33 suppress the variation of the current value. Accordingly, the inductors 32 and 33 provide a current source operation in a pseudo manner. Thus, the CMCD 2b according to this configuration example operates in a similar manner to the CMCD 2a shown in FIG. 1 in which two current sources are directly connected to two switching elements, respectively.

Figure 13:
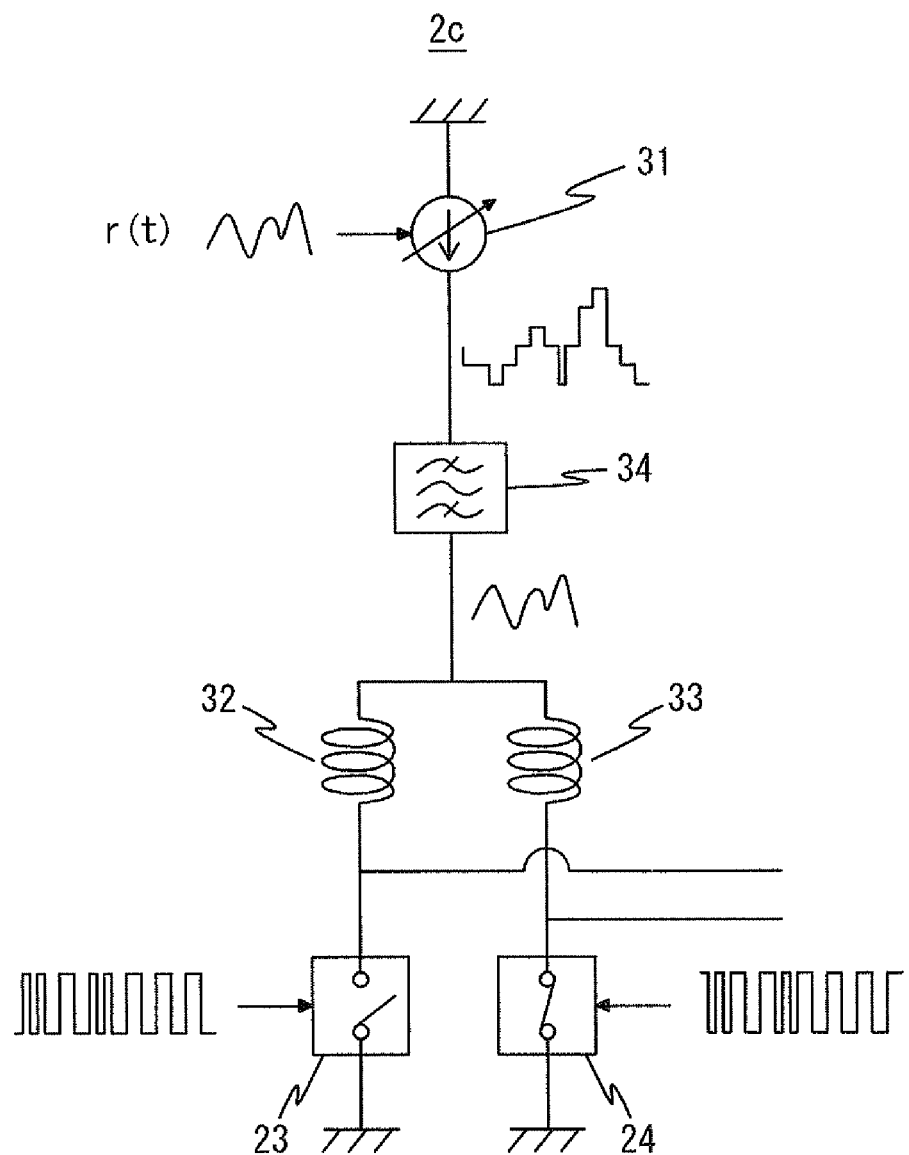
FIG. 13 is a block diagram showing a configuration of a CMCD 2c as a second configuration transformed example of the current mode class-D amplifier (CMCD) according to the first exemplary embodiment.

A second configuration transformed example of the CMCD will be described. FIG. 13 is a block diagram showing a configuration of a CMCD 2c which is the second configuration transformed example of the CMCD. The CMCD 2c has a configuration in which a filter circuit 34 is added to the CMCD 2b shown in FIG. 12. The filter circuit 34 is disposed between the variable current source 31 and the inductors 32 and 33. The other components of the CMCD 2c are similar to those of the CMCD 2b, so the description thereof is omitted. The filter circuit 34 removes undesired harmonic components generated in the variable current source 31.

Figure 14:
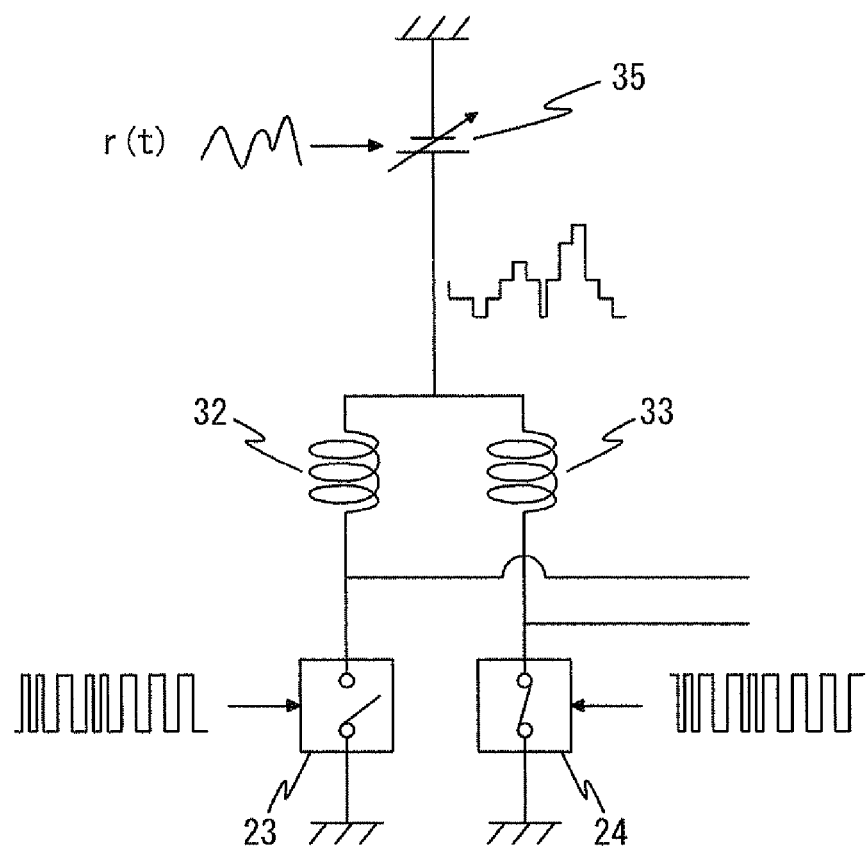
FIG. 14 is a block diagram showing a configuration of a CMCD 2d as a third configuration transformed example of the current mode class-D amplifier (CMCD) according to the first exemplary embodiment.

Further, a third configuration transformed example of the CMCD will be described. FIG. 14 is a block diagram showing a configuration of a CMCD 2d which is the third configuration transformed example of the CMCD. The CMCD 2d has a configuration in which the variable current source 31 of the CMCD 2b shown in FIG. 12 is replaced with a variable voltage source 35. In the CMCD 2d, the inductors 32 and 33 suppress the variation of the current value, as in the CMCD 2b shown in FIG. 12. Accordingly, the inductors 32 and 33 provide a current source operation in a pseudo manner. The other components of the CMCD 2d are similar to those of the CMCD 2b, so the description thereof is omitted. Thus, the CMCD 2d according to this configuration example operates in a similar manner to the CMCD 2a shown in FIG. 1 in which two current sources are directly connected to two switching elements, respectively.

Second Exemplary Embodiment

Figure 15:
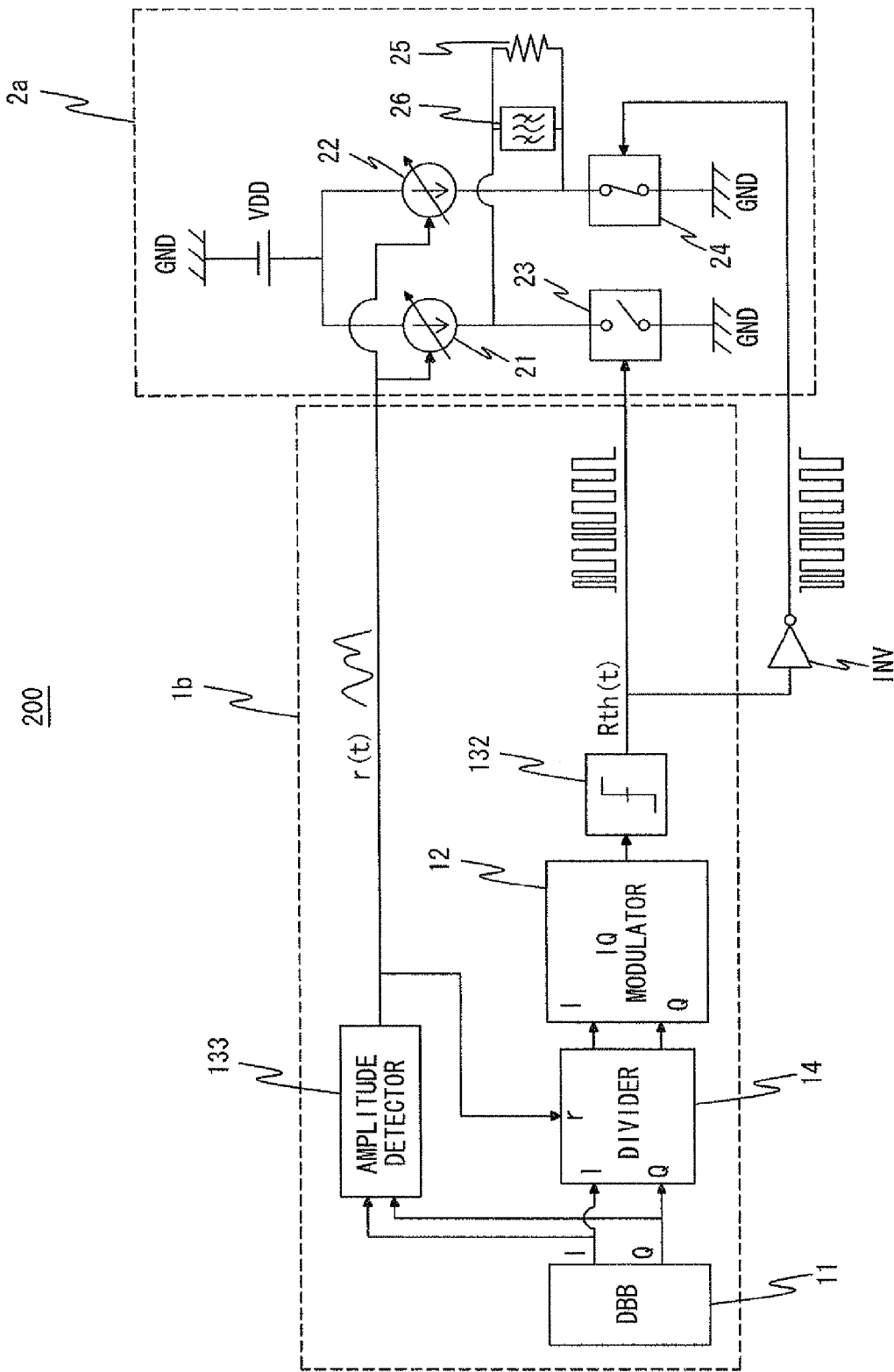
FIG. 15 is a block diagram showing a configuration of a transmitter 200 according to a second exemplary embodiment.

Next, a transmitter according to a second exemplary embodiment of the present invention will be described. FIG. 15 is a block diagram showing a configuration of a transmitter 200 according to the second exemplary embodiment. The transmitter 200 has a configuration in which the RF signal generator 1a of the transmitter 100 is replaced with an RF signal generator 1b. The other components of the transmitter 200 are similar to those of the transmitter 100, so the description thereof is omitted.

The RF signal generator 1b has a configuration in which a divider 14 is added to the RF signal generator 1a of the transmitter 100 and the amplitude detector 131 is replaced with an amplitude detector 133. In the transmitter 200, the DBB 11 outputs IQ signals to each of the divider 14 and the amplitude detector 133.

The divider 14 outputs signals obtained by dividing the IQ signals by the amplitude signal output from the amplitude detector 133. Radio signals Ib(t) and Qb(t) which are output from the divider 14 are expressed by the following expressions (15) and (16), respectively.

$$Ib(t)=I(t)/r(t) \tag{15}$$

$$Qb(t)=Q(t)/r(t) \tag{16}$$

The radio signals Ib(t) and Qb(t) output from the divider 14 are input to the IQ modulator 12 and converted into a radio signal of an RF band. The amplitude value of the output signal of the IQ modulator 12 is proportional to the amplitude value of the input IQ signals as shown in the expression (13). As shown in the expressions (15) and (16), Ib(t) and Qb(t) are specified by the amplitude signals of the IQ signals of the DBB 11. Accordingly, the amplitude value of the radio signal defined by Ib(t) and Qb(t) is "1". That is, the amplitude value of the output signal of the IQ modulator 12 according to this exemplary embodiment is "1". Therefore, an output signal RFb(t) of the IQ modulator 12 is expressed by the following expression (17) in which "1" is substituted in the amplitude signal r(t) on the right-hand side of the expression (2).

$$RFb(t)=th(t) \tag{17}$$

That is, the output signal of the IQ modulator 12 is the phase signal itself. The phase detector 132 determines the positive or negative of the output signal of the IQ modulator 12, and generates the rectangular phase signal shown in the expression (4).

Figure 16:
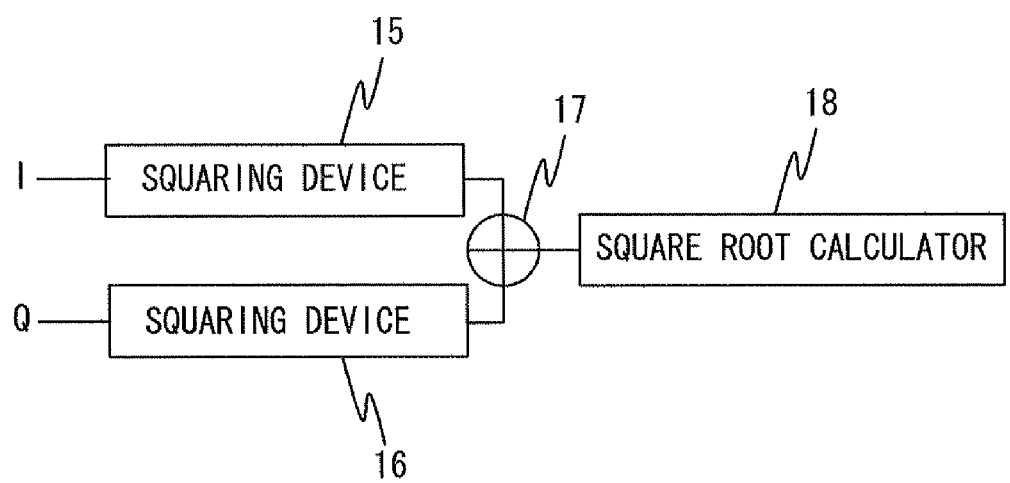
FIG. 16 is a block diagram showing a configuration of an amplitude detector 133 according to the second exemplary embodiment.
Figure 17:
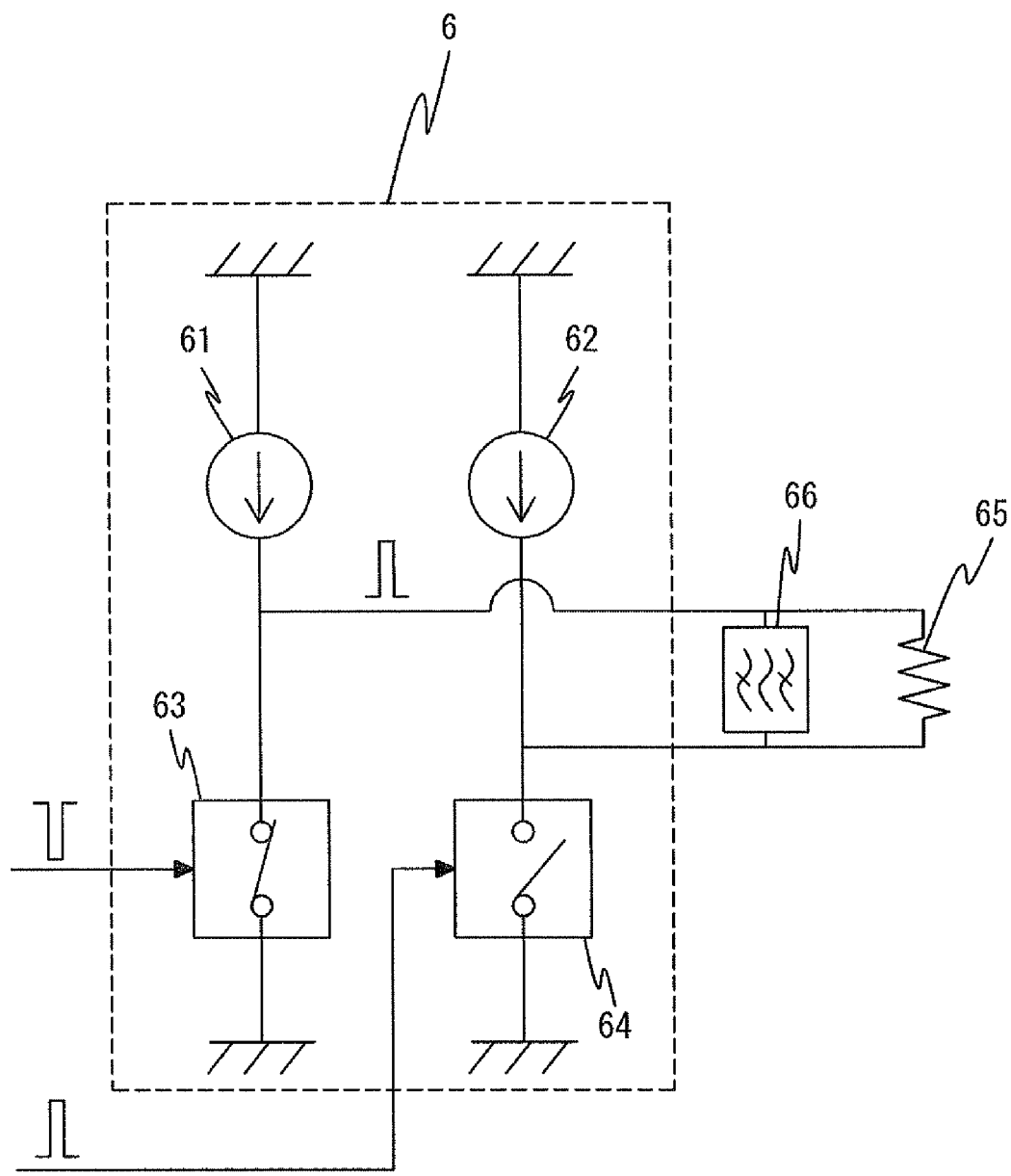
FIG. 17 is a circuit block diagram showing a configuration example of a current mode class-D amplifier (CMCD) 6 as a typical switching amplifier.
Figure 18:
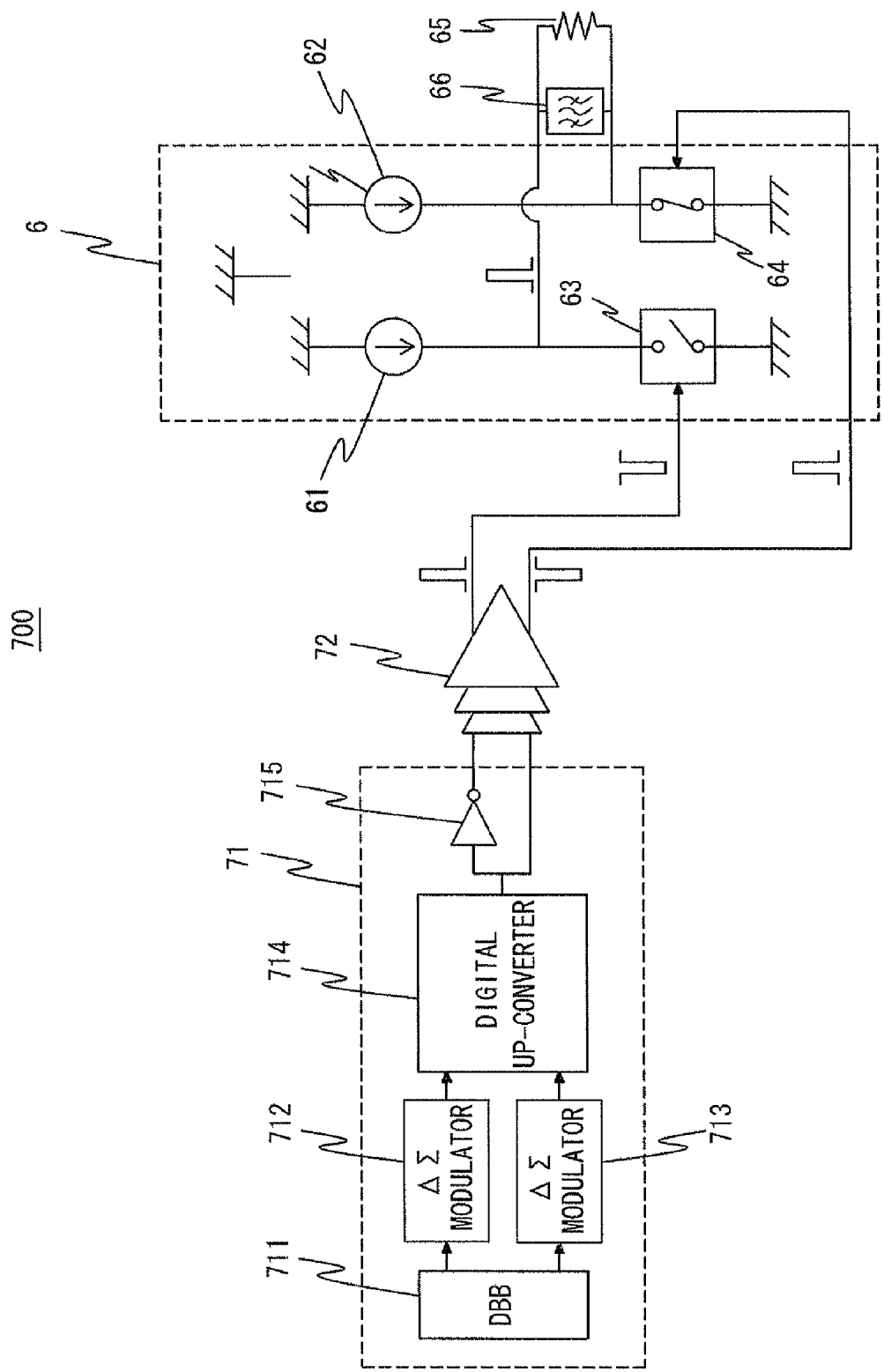
FIG. 18 is a circuit block diagram showing a configuration example of a transmitter 700 incorporating the current mode class-D amplifier (CMCD) 6.

Subsequently, the amplitude detector 133 will be described. FIG. 16 is a block diagram showing the configuration of the amplitude detector 133. In the amplitude detector 133, the I signal is input to a squaring device 15, and the Q signal is input to a squaring device 16. Signals output from the squaring devices 15 and 16 are added in an adder 17. A square root calculator 18 calculates the square root of the addition result obtained by the adder 17. That is, the amplitude detector 133 outputs the square root of the sum of squares of the input IQ signals. The square root of the sum of squares of the IQ signals corresponds to the amplitude value of the radio signal and is equal to the amplitude value r(t) shown on the right-hand side of the expression (2).

As described above, the RF signal generator 1b outputs the output signal of the amplitude detector 133 as an amplitude signal. The RF signal generator 1b also outputs the output signal of the phase detector 132 as a phase signal. The amplitude signal and phase signal output from the RF signal generator 1b are input to the CMCD 2a, as in the transmitter 100 according to the first exemplary embodiment. Thus, the CMCD 2a operates in the same manner as in the first exemplary embodiment, and the RF signal is reproduced in the load connected to the CMCD 2a.

Note that the present invention is not limited to the above exemplary embodiments, but can be modified as needed without departing from the gist of the present invention. For example, the CMCD 2a of the transmitter 200 according to the second exemplary embodiment can be replaced with one of the CMCDs 2b to 2d, as needed, as in the transmitter 100 according to the first exemplary embodiment.

The exemplary embodiments described above illustrate transmitters including the current mode class-D amplifier which is one mode of the switching amplifier. However, the amplifier that is applied to the present invention is not limited thereto. That is, other switching amplifiers can be applied in place of the current mode class-D amplifier.

While the present invention has been described above with reference to exemplary embodiments, the present invention is not limited to the above exemplary embodiments. The configuration and details of the present invention can be modified in various manners which can be understood by those skilled in the art within the scope of the invention.

This application is based upon and claims the benefit of priority from Japanese patent application No. 2010-174453, filed on Aug. 3, 2010, the disclosure of which is incorporated herein in its entirety by reference.

INDUSTRIAL APPLICABILITY

The present invention can be applied to, for example, communication devices such as a cellular phone and a wireless LAN.

REFERENCE SIGNS LIST 1a, 1b, 71 RF SIGNAL GENERATOR
2a-2d, 6 CURRENT MODE CLASS-D AMPLIFIER (CMCD)
11, 711 DIGITAL BASEBAND (DBB)
12 MODULATOR
13 AMPLITUDE PHASE SIGNAL DETECTOR
14 DIVIDER
15, 16 SQUARING DEVICE
17 ADDER
18 SQUARE ROOT CALCULATOR
21, 22, 31, 61, 62 VARIABLE CURRENT SOURCE
23, 24, 63, 64, SV1, SV2 SWITCHING ELEMENT
25, 65 LOAD
26, 34, 66 FILTER CIRCUIT
32, 33, 42, L1 INDUCTOR
35 VARIABLE VOLTAGE SOURCE
41 VARIABLE DC VOLTAGE SOURCE
43 CURRENT SENSOR
44 COMPARISON CONTROLLER
51 DC VOLTAGE SOURCE
52 VOLTAGE COMPARATOR
53 CODER
72 DRIVER AMPLIFIER
100, 200, 700 TRANSMITTER
121 LOCAL OSCILLATOR
122, 123 MIXER
124 SYNTHESIZER
131, 133 AMPLITUDE DETECTOR
132 PHASE DETECTOR
211 DECODER
212 PULSE VARIABLE CURRENT SOURCE
712 SIGMA-DELTA MODULATOR
714 DIGITAL UP-CONVERTER
715 INVERTER
A, B TERMINAL
AMP DIFFERENTIAL INPUT TYPE AMPLIFIER
C1, C13 CAPACITOR
CLKO EXTERNAL CLOCK SIGNAL SOURCE
CMP COMPARATOR
D13, DS DIODE
GND GROUND
INV INVERTER
Iv1-IvN DC CURRENT SOURCE
R13, Rs RESISTOR
S1-SN CURRENT SWITCH
SW CURRENT SWITCHING ELEMENT
T1 CONTROL TERMINAL
T2, T3 SIGNAL TERMINAL

The invention claimed is:
1. A transmitter comprising:
an RF signal generator that divides an input radio signal into an amplitude signal and a phase signal and outputs the amplitude signal and the phase signal; and
a switching amplifier that amplifies the radio signal with the amplitude signal and the phase signal,
wherein the switching amplifier comprises:
at least one variable current source that is controlled by the amplitude signal and supplies a current to the switching amplifier; and
at least one switching element that connects the variable current source to one of a ground potential and an output terminal of the switching amplifier according to the phase signal, and
wherein the switching amplifier comprises:
first and second variable current sources;
a first switching element that connects the first variable current source to one of a ground potential and a first output terminal of the switching amplifier according to the phase signal; and
a second switching element that connects the second variable current source to one of the ground potential and a second output terminal of the switching amplifier according to a signal complementary to the phase signal.

2. The transmitter according to claim 1, further comprising a filter circuit disposed between the variable current source and the switching element.

3. The transmitter according to claim 1, wherein
the variable current source comprises a field-effect transistor, and
the amplitude signal is input to a gate of the field-effect transistor.

4. The transmitter according to claim 1, wherein
the variable current source comprises a bipolar transistor, and
the amplitude signal is input to a base of the bipolar transistor.

5. The transmitter according to claim 1, wherein
the variable current source comprises:
    a plurality of DC current sources that output currents values of which are different from each other; and
    a current switch circuit that connects each of the DC current sources to one of a ground potential and an output terminal of the variable current source, each of the DC current sources being selected from the plurality of DC current sources according to the amplitude signal.

6. The transmitter according to claim 5, wherein
the variable current source comprises N (N is an integer equal to or greater than 2) number of DC current sources,
a current value output from a k (k is an integer equal to or greater than 2 and equal to or smaller than N)-th DC current source is twice as large as a current value output from a (k−1)-th DC current source, and
each bit of the amplitude signal composed of an N-bit digital signal is input as a control signal for each of the N number of DC current sources.

7. The transmitter according to claim 5, further comprising an AD converter that converts the amplitude signal into an N (N is an integer equal to or greater than 2)-bit digital signal, the amplitude signal being an analog signal, wherein
the variable current source comprises N number of DC current sources,
a current value output from a k (k is an integer equal to or greater than 2 and equal to or smaller than N)-th DC current source is twice as large as a current value output from a (k−1)-th DC current source, and
each bit of the N-bit digital signal is input as a control signal for each of the N number of DC current sources.

8. The transmitter according to claim 5, wherein
the current switch circuit comprises:
    a diode; and
    a switching element connected between an anode of the diode and a ground potential.

9. The transmitter according to claim 5, wherein
the DC current source comprises:
    a variable voltage source;
    an inductor connected to the variable voltage source;
    a current sensor that detects a current flowing through the inductor; and
    a comparison controller that controls an output voltage value of the variable voltage source such that the current flowing through the inductor and being detected by the current sensor has a predetermined value.

10. The transmitter according to claim 9, wherein
the current sensor comprises:
    a resistor that is supplied with the current flowing through the inductor; and
    a differential amplifier that amplifies a difference voltage between both ends of the resistor, and outputs an amplified signal to the comparison controller.

11. The transmitter according to claim 9, wherein
the variable current source comprises third and fourth switching elements disposed in series between a first power supply that outputs a power supply voltage and a second power supply that outputs a ground potential, the third and fourth switching elements being controlled by the comparison controller, and
the third switching element is opened and closed in a manner complementary to the fourth switching element.

12. The transmitter according to claim 11, wherein
the comparison controller compares the value of the current flowing through the inductor with the predetermined value, the current being detected by the current sensor, and
the comparison controller causes the third and fourth switching elements to be opened and closed in a manner complementary to each other based on a result of the comparison.

13. The transmitter according to claim 1, wherein the switching element comprises one of a field-effect transistor and a bipolar transistor.

14. The transmitter according to claim 1, wherein
the RF signal generator comprises:
    a digital baseband that generates IQ signals;
    an IQ modulator that performs IQ modulation on the IQ signals;
    an amplitude detector that detects an amplitude of a signal output from the IQ modulator and outputs the amplitude signal; and
    a phase detector that compares a signal output from the IQ modulator with a predetermined threshold, and outputs a binary digital signal as the phase signal.

15. The transmitter according to claim 1, wherein
the RF signal generator comprises:
    a digital baseband that generates an I signal and a Q signal;
    an amplitude detector that outputs a square root of a sum of squares of the I signal and the Q signal as the amplitude signal;
    a divider that divides the I signal and the Q signal by the amplitude signal;
    an IQ modulator that performs IQ modulation on a signal output from the divider; and
    a phase detector that compares a signal output from the IQ modulator with a predetermined threshold, and outputs a binary digital signal as the phase signal.

16. A transmitter comprising:
an RF signal generator that divides an input radio signal into an amplitude signal and a phase signal and outputs the amplitude signal and the phase signal; and
a switching amplifier that amplifies the radio signal with the amplitude signal and the phase signal,
wherein the switching amplifier comprises:
    at least one variable current source that is controlled by the amplitude signal and supplies a current to the switching amplifier; and
    at least one switching element that connects the variable current source to one of a ground potential and an output terminal of the switching amplifier according to the phase signal, and wherein the switching amplifier comprises:
one variable current source;
a first switching element that connects the one variable current source to one of a ground potential and a first output terminal of the switching amplifier according to the phase signal;
a second switching element that connects the one variable current source to one of the ground potential and a second output terminal of the switching amplifier according to a signal complementary to the phase signal;
a first inductor disposed between the one variable current source and the first switching element; and
a second inductor disposed between the one variable current source and the second switching element.

17. A transmitter comprising:
an RF signal generator that divides an input radio signal into an amplitude signal and a phase signal and outputs the amplitude signal and the phase signal; and
a switching amplifier that amplifies the radio signal with the amplitude signal and the phase signal,
wherein the switching amplifier comprises:
at least one variable current source that is controlled by the amplitude signal and supplies a current to the switching amplifier; and
at least one switching element that connects the variable current source to one of a ground potential and an output terminal of the switching amplifier according to the phase signal, and
wherein the switching amplifier comprises:
first and second variable current sources;
a first switching element that connects the one variable current source to one of a ground potential and a first output terminal of the switching amplifier according to the phase signal; and
a second switching element that connects the one variable current source to one of the ground potential and a second output terminal of the switching amplifier according to a signal complementary to the phase signal, and
the one variable current source comprises:
a variable voltage source that is controlled by the amplitude signal and supplies a current to the switching amplifier;
a first inductor disposed between the variable voltage source and the first switching element; and
a second inductor disposed between the variable voltage source and the second switching element.

18. A method for controlling a transmitter, comprising:
dividing an input radio signal into an amplitude signal and a phase signal and outputting the amplitude signal and the phase signal to a switching amplifier;
amplifying the radio signal with the amplitude signal and the phase signal by the switching amplifier; and
in the switching amplifier, connecting a variable current source controlled by the amplitude signal to one of a terminal connected to a ground potential and an output terminal according to the phase signal, wherein
the switching amplifier comprises first and second variable current sources,
a first switching element that connects the first variable current source to one of a ground potential and a first output terminal of the switching amplifier according to the phase signal; and
a second switching element that connects the second variable current source to one of the ground potential and a second output terminal of the switching amplifier according to a signal complementary to the phase signal.

* * * * *